United States Patent
Lunt, III et al.

(10) Patent No.: US 11,784,009 B2
(45) Date of Patent: Oct. 10, 2023

(54) FLEXIBLE INORGANIC PEROVSKITE SOLAR CELLS AND ROOM-TEMPERATURE PROCESSING THEREOF

(71) Applicant: Board of Trustees of Michigan State University, East Lansing, MI (US)

(72) Inventors: Richard R. Lunt, III, Williamston, MI (US); Dianyi Liu, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 12 days.

(21) Appl. No.: 17/051,003

(22) PCT Filed: May 1, 2019

(86) PCT No.: PCT/US2019/030209
§ 371 (c)(1),
(2) Date: Oct. 27, 2020

(87) PCT Pub. No.: WO2019/213265
PCT Pub. Date: Nov. 7, 2019

(65) Prior Publication Data
US 2021/0233717 A1   Jul. 29, 2021

Related U.S. Application Data

(60) Provisional application No. 62/665,724, filed on May 2, 2018.

(51) Int. Cl.
*H01G 9/20* (2006.01)
*C01G 21/00* (2006.01)
*H01G 9/00* (2006.01)

(52) U.S. Cl.
CPC ......... *H01G 9/2009* (2013.01); *C01G 21/006* (2013.01); *H01G 9/0036* (2013.01);
(Continued)

(58) Field of Classification Search
None
See application file for complete search history.

(56) References Cited

U.S. PATENT DOCUMENTS

2007/0089784 A1* 4/2007 Noh ................. B82Y 20/00
                                                           345/44
2017/0229518 A1* 8/2017 Uddin ................ H01L 27/302
(Continued)

FOREIGN PATENT DOCUMENTS

| CN | 106622922 A | 5/2017 |
| CN | 107104190 A | 8/2017 |
| KR | 101835233 B1 | 3/2018 |

OTHER PUBLICATIONS

Di Giacomo et al, Adv. Energy Mater. 2015, 5, 1401808. (Year: 2015).*

(Continued)

*Primary Examiner* — Eli S Mekhlin
(74) *Attorney, Agent, or Firm* — Harness, Dickey & Pierce PLC

(57) ABSTRACT

A flexible photovoltaic device is provided. The flexible photovoltaic device includes a flexible inorganic halide perovskite. The flexible inorganic halide perovskite is free of organic components, has a thickness of greater than or equal to about 1 μm to less than or equal to about 1 nm, and has an average grain size of less than or equal to about 500 nm.

37 Claims, 12 Drawing Sheets

(52) U.S. Cl.
CPC ....... *H01G 9/2095* (2013.01); *C01P 2002/34* (2013.01); *C01P 2002/60* (2013.01); *C01P 2002/72* (2013.01); *C01P 2004/03* (2013.01); *C01P 2006/40* (2013.01)

(56) References Cited

U.S. PATENT DOCUMENTS

2017/0287648 A1* 10/2017 Wu ..................... H01L 51/0028
2018/0066383 A1   3/2018 Bakr et al.
2019/0206630 A1*  7/2019 Choy .................. H10K 71/311

OTHER PUBLICATIONS

Kim et al. "Highly efficient and bending durable perovskite solar cells: Toward a wearable power source" Energy & Environmental Science, vol. 8, pp. 916-921 (2015).

Brittman et al, "The expanding world of hybrid perovskites: materials properties and emerging applications" MRS Communications, vol. 5, pp. 7-26 (2015).

Yang et al "Visibly transparent organic photovoltaic with improved transparency and absorption based on tandem photonic crystal for greenhouse application", Applied Optics. 30, vol. 54, pp. 10232-10239 (2015).

Ono et al "Organometal halide perovskite thin films and solar cells by vapor deposition" Journal of Materials C hemistry A., vol. 4, pp. 6693-6713 (2015).

International Search Report and Written Opinion of the International Searching Authority, issued in PCT/US2019/030209, dated Aug. 5, 2019; ISA/US.

Sharma et al. Phase-Diagrams of Quasi-Binary Systems of the Type-Abx3-A'bx3 Abx3-Ab'x3, and Abx3-Abx'3 X=Halogen. Zeitschrift Fur Physikalische Chemie—International Journal of Research in Physical Chemistry & Chemical Physics, 175, 63-80 (1992).

Sutton et al. "Bandgap-tunable cesium lead halide perovskites with high thermal stability for efficient solar cells." Advanced Energy Materials 6.8 (2016): 1502458.

Beal et al. "Cesium lead halide perovskites with improved stability for tandem solar cells." The journal of physical chemistry letters 7.5 (2016): 746-751.

Liang et al. "All-inorganic perovskite solar cells." Journal of the American Chemical Society 138.49 (2016): 15829-15832.

Zhang et al. "3D-2D-0D interface profiling for record efficiency all-inorganic CsPbBrI2 perovskite solar cells with superior stability." Advanced energy materials 8.15 (2018): 1703246.

Zeng et al. "Polymer-passivated inorganic cesium lead mixed-halide perovskites for stable and efficient solar cells with high open-circuit voltage over 1.3 V." Advanced materials 30.9 (2018): 1705393.

Niezgoda et al. "Improved charge collection in highly efficient CsPbBrI2 solar cells with light-induced dealloying." ACS Energy Letters 2.5 (2017): 1043-1049.

Nam et al. "Unveiling the crystal formation of cesium lead mixed-halide perovskites for efficient and stable solar cells." The journal of physical chemistry letters 8.13 (2017): 2936-2940.

Nam et al. "Potassium incorporation for enhanced performance and stability of fully inorganic cesium lead halide perovskite solar cells." Nano letters 17.3 (2017): 2028-2033.

Ma et al. "The effect of stoichiometry on the stability of inorganic cesium lead mixed-halide perovskites solar cells." The Journal of Physical Chemistry C 121.36 (2017): 19642-19649.

Li et al. "Phase segregation enhanced ion movement in efficient inorganic CsPbIBr2 solar cells." Advanced Energy Materials 7.20 (2017): 1700946.

Frolova et al. "Highly efficient all-inorganic planar heterojunction perovskite solar cells produced by thermal coevaporation of CsI and PbI2." The journal of physical chemistry letters 8.1 (2017): 67-72.

Chen et al. "All-vacuum-deposited stoichiometrically balanced inorganic cesium lead halide perovskite solar cells with stabilized efficiency exceeding 11%." Advanced materials 29.12 (2017): 1605290.

Di Giacomo et al. "Flexible perovskite photovoltaic modules and solar cells based on atomic layer deposited compact layers and UV-irradiated TiO2 scaffolds on plastic substrates." Advanced Energy Materials 5.8 (2015): 1401808.

* cited by examiner

FLEXIBLE INORGANIC PEROVSKITE SOLAR CELLS AND ROOM-TEMPERATURE PROCESSING THEREOF

CROSS-REFERENCE TO RELATED APPLICATIONS

This application is a 371 U.S. National Phase of International Application No. PCT/US2019/030209, filed May 1, 2019, which claims the benefit of U.S. Provisional Application No. 62/665,724, filed on May 2, 2018. The entire disclosures of the above applications are incorporated herein by reference.

FIELD

The present disclosure relates to flexible inorganic perovskite solar cells and a method of processing the flexible inorganic perovskite solar cells at room-temperature.

BACKGROUND

This section provides background information related to the present disclosure which is not necessarily prior art.

Halide perovskite materials have recently emerged as strong candidates for photovoltaic applications. High device efficiency and low materials costs give perovskite solar cells (PSCs) great potential as a competitor for silicon solar cells. Hybrid organic-inorganic PSCs with a power conversion efficiency (PCE) of up to 22.7% have been reported, which is higher than the efficiencies of polycrystalline silicon solar cells, cadmium telluride (CdTe) solar cells, and copper-indium-gallium selenide (CIGS) solar cells. However, the stability of organic-inorganic halide perovskite materials is still a key challenge for the application of PSCs in commercial applications due to high volatility of organic components in hybrid perovskite compounds.

In contrast, inorganic perovskite materials may allow for better intrinsic thermal stability. Previous research suggests that pure $CsPbI_3$ perovskite can maintain the stable cubic phase over 400° C. Thus, significant effort has been focused on developing PSCs with inorganic cesium lead halide light absorbers. For example, the stability behavior of cesium lead halide compounds has been investigated and inorganic PSCs with a PCE of 9.84% achieved; the vacuum-deposition method has been utilized to prepare inorganic cesium halide PSCs with a device efficiency over 11%; and a polymer-passivated cesium lead halide PSC based on inorganic perovskite nanocrystals with a PCE of over 12% and an open-circuit voltage ($V_{oc}$) of over 1.3 V has been reported. Despite the rapid progress in improving efficiencies with inorganic PSCs, the processing of inorganic perovskite film remains a challenge. Because the conversion temperature of $CsPbI_3$ from the non-perovskite phase to cubic perovskite phase occurs at over 300° C., the fabrication process of $CsPbI_{3-x}Br_x$-based inorganic perovskite films generally requires a thermal annealing treatment at temperatures up to 350° C. The high temperature thermal annealing treatment not only increases the cost of inorganic PSCs, but can also prevent the application of inorganic perovskite materials on polymer-based flexible substrates.

To reduce the operation temperature of cesium lead halide perovskite films, several approaches have been examined. For example, it has been shown that doping a small amount of bromide (Br) can dramatically decrease the formation temperature of $CsPbI_3$ film. Low temperature processing of $CsPbBrI_2$ film as a light absorber has been reported, with the device fabricated at a temperature under 135° C. and a PCE of up to 6.5%. Other efforts have introduced various additives to decrease the fabrication temperature, including hydroiodic acid, bismuth iodide, sulfobetaine zwitterions, and ethylammonium iodide. With these additives, the cubic phase $CsPbI_{3-x}Br_x$ film can be formed under 90-150° C. However, the thermal annealing treatment still remains an essential step for preparation of the cesium lead halide perovskite films.

Room temperature processing is not only important to simplify the fabrication procedure, but also because it enables fabrication on flexible substrates. Although inorganic lead halide films have been fabricated, these films require high temperature annealing of $TiO_2$ (450-500° C.) and pre-synthesized perovskite quantum dots. In addition, despite reports of flexible solar cells based on the organic-inorganic hybrid perovskite materials, flexible inorganic perovskite solar cells have not been demonstrated. Accordingly, there remains a need to develop room temperature processing methods to enable the development of flexible inorganic perovskite solar cells.

SUMMARY

This section provides a general summary of the disclosure, and is not a comprehensive disclosure of its full scope or all of its features.

In various aspects, the current technology provides a flexible photovoltaic device including a flexible inorganic halide perovskite.

In one aspect, the flexible inorganic halide perovskite is free of organic components.

In one aspect, the flexible inorganic halide perovskite has a thickness of greater than or equal to about 1 nm to less than or equal to about 1 μm.

In one aspect, the flexible inorganic halide perovskite has an average grain size of less than or equal to about 500 nm.

In one aspect, the flexible inorganic halide perovskite has an average grain size of less than or equal to about 100 nm.

In one aspect, the flexible inorganic halide perovskite has a bend radius of greater than or equal to about 1 mm to less than or equal to about 100 mm.

In one aspect, the flexible inorganic halide perovskite has a bend radius of greater than or equal to about 3 mm to less than or equal to about 10 mm.

In one aspect, the flexible inorganic halide perovskite corresponds to the formula $A_mB_nX_{m+2n}$, $A_mB_nX_{m'+4n'}$, $A_{m''}B_{n''}B'_{n'''}X_{m''+2n''+4n'''}$, $A_mC_nX_{m+3n}$, $A_mC_nD_lX_{m+3n+l}$, or $(A'X)_mB_nX_{m+2n}$, wherein A is a 1+ alkali metal, a 1+ transition metal, a 1+ lanthanide, a 1+ actinide, or a 1+ compound having the formula A'X; A' is an alkaline earth metal, a 2+ transition metal, a 2+ lanthanide, a 2+ actinide, or a combination thereof; B is a 2+ alkaline earth metal, a 2+ transition metal, a 2+ crystallogen, a 2+ lanthanide, a 2+ actinide, or a combination thereof; B' is a 4+ metal or a combination of 4+ metals; C is a 3+ pnictogen, a 3+ icosagen, a 3+ transition metal, or a combination thereof; D is silver (Ag), copper (Cu), gold (Au), indium (In I), thallium (Tl I), or a combination thereof; X is an inorganic anion or a combination of inorganic anions; and m, m', m", n, n', n", n"*, and l are individually integers having a value of 0 or greater.

In one aspect, the flexible inorganic halide perovskite is selected from the group including $CsSiCl_3$, $CsSiBr_3$, $CsSiI_3$, $RbSiCl_3$, $RbSiBr_3$, $KSiCl_3$, $KSiBr_3$, $KSiI_3$, $Cs_2SiCl_4$, $Cs_2SiBr_4$, $Cs_2SiI_4$, $Rb_2SiCl_4$, $Rb_2SiBr_4$, $Rb_2SiI_4$, $CsSi_2Cl_5$, $Cs_2SiCl_6$, $Cs_2Si(II)Si(IV)Cl_8$, $CsSi_2Br_5$, $CsSi_2Br_6$, $Cs_2Si(II)$ $Si(IV)Br_8$, $CsSi_2I_5$, $Cs_2SiI_6$, $Cs_2Si(II)Si(IV)I_8$, $RbSi_2Cl_5$, $Rb_2SiCl_6$, $Rb_2Si(II)Si(IV)Cl_8$, $RbSi_2Br_5$, $Rb_2SiBr_6$, $Rb_2Si(II)Si(IV)Br_8$, $RbSi_2I_5$, $Rb_2SiI_6$, $Rb_2Si(II)Si(IV)I_8$, $KSi_2Cl_5$, $K_2SiCl_6$, $K_2Si(II)Si(IV)Cl_8$, $KSi_2Br_5$, $K_2SiBr_6$, $K_2Si(II)Si(IV)Br_8$, $KSi_2I_5$, $K_2SiI_6$, $K_2Si(II)Si(IV)I_8$, $CsGeCl_3$, $CsGeBr_3$, $CsGeI_3$, $RbGeCl_3$, $RbGeBr_3$, $KGeCl_3$, $KGeBr_3$, $KGeI_3$, $Cs_2GeCl_4$, $Cs_2GeBr_4$, $Cs_2GeI_4$, $Rb_2GeCl_4$, $Rb_2GeBr_4$, $Rb_2GeI_4$, $CsGe_2Cl_5$, $Cs_2GeCl_6$, $Cs_2Ge(II)Ge(IV)Cl_8$, $CsGe_2Br_5$, $Cs_2GeBr_6$, $Cs_2Ge(II)Ge(IV)Br_8$, $CsGe_2I_5$, $Cs_2GeI_6$, $Cs_2Ge(II)Ge(IV)I_8$, $RbGe_2Cl_5$, $Rb_2GeCl_6$, $Rb_2Ge(II)Ge(IV)Cl_8$, $RbGe_2Br_5$, $Rb_2GeBr_6$, $Rb_2Ge(II)Ge(IV)Br_8$, $RbGe_2I_5$, $Rb_2GeI_6$, $Rb_2Ge(II)Ge(IV)I_8$, $KGe_2Cl_5$, $K_2GeCl_6$, $K_2Ge(II)Ge(IV)Cl_8$, $KGe_2Br_5$, $K_2GeBr_6$, $K_2Ge(II)Ge(IV)Br_8$, $KGe_2I_5$, $K_2GeI_6$, $K_2Ge(II)Ge(IV)I_8$, $CsSnCl_3$, $CsSnBr_3$, $CsSnI_3$, $RbSnCl_3$, $RbSnBr_3$, $KSnCl_3$, $KSnBr_3$, $KSnI_3$, $Cs_2SnCl_4$, $Cs_2SnBr_4$, $Cs_2SnI_4$, $Rb_2SnCl_4$, $Rb_2SnBr_4$, $Rb_2SnI_4$, $CsSn_2Cl_5$, $Cs_2SnCl_6$, $Cs_2Sn(II)Sn(IV)Cl_8$, $CsSn_2Br_5$, $Cs_2SnBr_6$, $Cs_2Sn(II)Sn(IV)Br_8$, $CsSn_2I_5$, $Cs_2SnI_6$, $Cs_2Sn(II)Sn(IV)I_8$, $RbSn_2Cl_5$, $Rb_2SnCl_6$, $Rb_2Sn(II)Sn(IV)Cl_8$, $RbSn_2Br_5$, $Rb_2SnBr_6$, $Rb_2Sn(II)Sn(IV)Br_8$, $RbSn_2I_5$, $Rb_2SnI_6$, $Rb_2Sn(II)Sn(IV)I_8$, $KSn_2Cl_5$, $K_2SnCl_6$, $K_2Sn(II)Sn(IV)Cl_8$, $KSn_2Br_5$, $K_2SnBr_6$, $K_2Sn(II)Sn(IV)Br_8$, $KSn_2I_5$, $K_2SnI_6$, $K_2Sn(II)Sn(IV)I_8$, $Cs_3Bi_2Cl_9$, $Cs_3Bi_2Br_9$, $Cs_3Bi_2I_9$, $Cs_3Sb_2Cl_9$, $Cs_3Sb_2Br_9$, $Cs_3Sb_2I_9$, $CsPbCl_3$, $CsPbBr_3$, $CsPbI_3$, $CsPbI_2Br$, $CsPbIBr_2$, $Cs_2TiCl_6$, $Cs_2TiBr_6$, $Cs_2TiI_6$, $Cs_2TiCl_3Br_3$, $Cs_2TiCl_3I_3$, $Cs_2TiBr_3I_3$, $Cs_2TiCl_2Br_4$, $Cs_2TiCl_2I_4$, $Cs_2TiCl_4Br_2$, $Cs_2TiCl_4I_2$, $Cs_2TiBr_2I_4$, $Cs_2TiBr_4I_2$, $RbPbCl_3$, $RbPbBr_3$, $KPbCl_3$, $KPbBr_3$, $KPbI_3$, $Cs_2PbCl_4$, $Cs_2PbBr_4$, $Cs_2PbI_4$, $Rb_2PbCl_4$, $Rb_2PbBr_4$, $Rb_2PbI_4$, $CsPb_2Cl_5$, $Cs_2PbCl_6$, $Cs_2Pb(II)Pb(IV)Cl_8$, $CsPb_2Br_5$, $Cs_2PbBr_6$, $Cs_2Pb(II)Pb(IV)Br_8$, $CsPb_2I_5$, $Cs_2PbI_6$, $Cs_2Pb(II)Pb(IV)I_8$, $RbPb_2Cl_5$, $Rb_2PbCl_6$, $Rb_2Pb(II)Pb(IV)Cl_8$, $RbPb_2Br_5$, $Rb_2PbBr_6$, $Rb_2Pb(II)Pb(IV)Br_8$, $RbPb_2I_5$, $Rb_2PbI_6$, $Rb_2Pb(II)Pb(IV)I_8$, $KPb_2Cl_5$, $K_2PbCl_6$, $K_2Pb(II)Pb(IV)Cl_8$, $KPb_2Br_5$, $K_2PbBr_6$, $K_2Pb(II)Pb(IV)Br_8$, $KPb_2I_5$, $K_2PbI_6$, $K_2Pb(II)Pb(IV)I_8$, $Cs_2AgBiCl_6$, $Cs_2CuBiCl_6$, $Cs_2InAgCl_6$, $Cs_2InCuCl_6$, $Cs_2AgSbCl_6$, $Cs_2CuSbCl_6$, $Cs_2AgBiBr_6$, $Cs_2CuBiBr_6$, $Cs_2InAgBr_6$, $Cs_2InCuBr_6$, $Cs_2AgBiI_6$, $Cs_2CuBiI_6$, $Cs_2AgSbBr_6$, $Cs_2CuSbBr_6$, $Cs_2AgSbI_6$, $Cs_2CuSbI_6$, $Cs_2InAgI_6$, $Cs_2InCuI_6$, $Cs_3Bi_2Cl_9$, $Cs_3Bi_2Br_9$, $Cs_3Bi_2I_9$, $Cs_3Sb_2Cl_9$, $Cs_3Sb_2Br_9$, $Cs_3Sb_2I_9$, $Cs_3In_2Cl_9$, $Cs_3In_2Br_9$, $Cs_3In_2I_9$, $K_2AgBiCl_6$, $K_2CuBiCl_6$, $K_2InAgCl_6$, $K_2InCuCl_6$, $K_2AgSbCl_6$, $K_2CuSbCl_6$, $K_2AgBiBr_6$, $K_2CuBiBr_6$, $K_2InAgBr_6$, $K_2InCuBr_6$, $K_2AgBiI_6$, $K_2CuBiI_6$, $K_2AgSbBr_6$, $K_2CuSbBr_6$, $K_2AgSbI_6$, $K_2CuSbI_6$, $K_2InAgI_6$, $K_2InCuI_6$, $K_3Bi_2Cl_9$, $K_3Bi_2Br_9$, $K_3Bi_2I_9$, $K_3Sb_2Cl_9$, $K_3Sb_2Br_9$, $K_3Sb_2I_9$, $K_3In_2Cl_9$, $K_3In_2Br_9$, $K_3In_2I_9$, $Na_2AgBiCl_6$, $Na_2CuBiCl_6$, $Na_2InAgCl_6$, $Na_2InCuCl_6$, $Na_2AgSbCl_6$, $Na_2CuSbCl_6$, $Na_2AgBiBr_6$, $Na_2CuBiBr_6$, $Na_2InAgBr_6$, $Na_2InCuBr_6$, $Na_2AgBiI_6$, $Na_2CuBiI_6$, $Na_2AgSbBr_6$, $Na_2CuSbBr_6$, $Na_2AgSbI_6$, $Na_2CuSbI_6$, $Na_2InAgI_6$, $Na_2InCuI_6$, $Na_3Bi_2Cl_9$, $Na_3Bi_2Br_9$, $Na_3Bi_2I_9$, $Na_3Sb_2Cl_9$, $Na_3Sb_2Br_9$, $Na_3Sb_2I_9$, $Na_3In_2Cl_9$, $Na_3In_2Br_9$, $Na_3In_2I_9$, $Li_2AgBiCl_6$, $Li_2CuBiCl_6$, $Li_2InAgCl_6$, $Li_2InCuCl_6$, $Li_2AgSbCl_6$, $Li_2CuSbCl_6$, $Li_2AgBiBr_6$, $Li_2CuBiBr_6$, $Li_2InAgBr_6$, $Li_2InCuBr_6$, $Li_2AgBiI_6$, $Li_2CuBiI_6$, $Li_2AgSbBr_6$, $Li_2CuSbBr_6$, $Li_2AgSbI_6$, $Li_2CuSbI_6$, $Li_2InAgI_6$, $Li_2InCuI_6$, $Li_3Bi_2Cl_9$, $Li_3Bi_2Br_9$, $Li_3Bi_2I_9$, $Li_3Sb_2Cl_9$, $Li_3Sb_2Br_9$, $Li_3Sb_2I_9$, $Li_3In_2Cl_9$, $Li_3In_2Br_9$, $Li_3In_2I_9$, and combinations thereof.

In one aspect, the flexible photovoltaic device further includes a substrate having an electrically conductive surface, wherein the flexible inorganic halide perovskite is disposed on the electrically conductive surface of the substrate.

In one aspect, the entire substrate is electrically conductive.

In one aspect, the substrate has an electrically non-conductive layer and an electrically conductive layer, wherein the electrically conductive layer includes the electrically conductive surface.

In one aspect, the electrically conductive surface is a first electrode and the flexible photovoltaic device further includes a second electrode disposed on the flexible inorganic halide perovskite, wherein the flexible inorganic halide perovskite is disposed between the first electrode and the second electrode.

In one aspect, each of the substrate, the first electrode, and the second electrode are flexible.

In one aspect, the flexible photovoltaic device further includes at least one flexible adjunct layer selected from the group including a hole transport layer, an electron blocking layer, a buffer layer, an electron transport layer, a hole blocking layer, an electron extraction layer; and combinations thereof, wherein the at least one flexible adjunct layer is disposed between the first electrode and the flexible inorganic halide perovskite, between the second electrode and the flexible inorganic halide perovskite, or between both the first electrode and the flexible inorganic halide perovskite and between the second electrode and the flexible inorganic halide perovskite.

In one aspect, the flexible photovoltaic device has a power conversion efficiency (PCE) of greater than or equal to about 5%.

In one aspect, the flexible inorganic halide perovskite is provided in a layer and the entire flexible photovoltaic device is visibly transparent.

In one aspect, the flexible inorganic halide perovskite is not thermally annealed.

In one aspect, the flexible inorganic halide perovskite is thermally annealed at a temperature of less than or equal to about 100° C.

In various aspects, the current technology further provides a method of fabricating a flexible inorganic halide perovskite, the method including disposing a precursor solution on a substrate, the precursor solution having a first perovskite precursor and a second perovskite precursor dissolved in a solvent; applying a negative pressure to the precursor solution at room temperature to remove the solvent and generating a flexible inorganic halide perovskite on the substrate.

In one aspect, the method is free from heating at a temperature of greater than 100° C.

In one aspect, the method is free from heating at a temperature of greater than 30° C.

In one aspect, the first perovskite precursor corresponds to the formula AX, A'X, A'X$_2$, or a combination thereof, and the second perovskite precursor corresponds to the formula BX$_2$, B'X$_4$, CX$_3$, DX, or a combination thereof, and the method further includes reacting the first perovskite precursor with the second perovskite precursor to form the flexible inorganic halide perovskite, the flexible inorganic halide perovskite corresponding to the formula $A_mB_nX_{m+2n}$, $A_mB_nX_{m'+4n'}$, $A_{m''}B_{n''}B'_{n'''}X_{m''+2n''+4n'''}$, $A_mC_nX_{m+3n}$, $A_mC_nD_lX_{m+3n+l}$, or $(A'X)_mB_nX_{m+2n}$, wherein A is a 1+ alkali metal, a 1+ transition metal, a 1+ lanthanide, a 1+ actinide, or a 1+ compound having the formula A'X, A' is an alkaline earth metal, a 2+ transition metal, a 2+ lanthanide, a 2+ actinide, or a combination thereof; B is a 2+ alkaline earth metal, a 2+ transition metal, a 2+ crystallogen, a 2+ lanthanide, a 2+ actinide, or a combination thereof; B' is a 4+ metal or a combination of 4+ metals; C is a 3+ pnictogen, a 3+ icosagen, a 3+ transition metal, or a combination thereof; D is silver (Ag), copper (Cu), gold (Au), indium (In I), thallium (Tl I), or a combination thereof; X is an inorganic anion or a combination of inorganic anions; and m, m', m", n, n', n", n"*, and l are individually integers having a value of 0 or greater.

In one aspect, A is cesium (Cs), rubidium (Rb), potassium (K), sodium (Na), lithium (Li), copper (Cu I), or a combination thereof; A' is beryllium (Be), magnesium (Mg), calcium (Ca), strontium (Sr), barium (Ba), iron (Fe II), chromium (Cr II), cobalt (Co II), nickel (Ni II), manganese (Mn II), lead (Pb II), copper (Cu II), vanadium (V II), zinc (Zn II), or a combination thereof; B is tin (Sn), lead (Pb), copper (Cu II), germanium (Ge), or a combination thereof; B' is tin (Sn), germanium (Ge), lead (Pb), or a combination thereof; C is bismuth (Bi), antimony (Sb), indium (In III), iron (Fe), aluminum (Al), or a combination thereof; and X is an inorganic anion selected from the group including a halogen, an oxalate, a hydroxide, a chlorate, an iodate, a nitrite, a sulfate, a thiosulfate, a phosphate, an antimonite, or a combination thereof.

In one aspect, the solvent is selected from the group including N-methyl-2-pyrrolidone (NMP), N,N-dimethylformamide (DMF), dimethyl sulfoxide (DMSO), γ-butyrolactone (GBL), 2-methoxyethyl ether, 2-(2-ethoxyethoxy) ethanol, and combinations thereof.

In one aspect, the applying the negative pressure to the precursor solution includes subjecting the precursor solution to a negative pressure of less than or equal to about 1500 mTorr for a time period of greater than or equal to about 5 seconds to less than or equal to about 24 hours.

In one aspect, the precursor solution further includes a dopant dissolved in the solvent.

In one aspect, the current technology provides the flexible inorganic halide perovskite made by the method.

In various aspects, the current technology further provides a method of fabricating a photovoltaic device, the method including disposing a precursor solution on a flexible substrate, the precursor solution having a first perovskite precursor corresponding to the formula AX, A'X, A'X$_2$, or a combination thereof, and a second perovskite precursor corresponding to the formula BX$_2$, B'X$_4$, CX$_3$, DX, or a combination thereof, the first and second perovskite precursors being dissolved in a solvent; applying a negative pressure to the precursor solution without supplying heat to remove the solvent; and generating a flexible inorganic halide perovskite film on the substrate, wherein the flexible inorganic halide perovskite corresponds to the formula $A_mB_nX_{m+2n}$, $A_mB_nX_{m'+4n}$, $A_{m''}B_{n''}B'_{n'''}X_{m''+2n''+4n'''*}$, $A_mC_nX_{m+3n}$, $A_mC_nD_lX_{m+3n+l}$, or $(A'X)_mB_nX_{m+2n}$, wherein A is a 1+ alkali metal, a 1+ transition metal, a 1+ lanthanide, a 1+ actinide, or a 1+ compound having the formula A'X; A' is an alkaline earth metal, a 2+ transition metal, a 2+ lanthanide, a 2+ actinide, or a combination thereof; B is a 2+ alkaline earth metal, a 2+ transition metal, a 2+ crystallogen, a 2+ lanthanide, a 2+ actinide, or a combination thereof; B' is a 4+ metal or a combination of 4+ metals; C is a 3+ pnictogen, a 3+ icosagen, a 3+ transition metal, or a combination thereof; D is silver (Ag), copper (Cu), gold (Au), indium (In I), thallium (Tl I), or a combination thereof; X is an inorganic anion or a combination of inorganic anions; and m, m', m", n, n', n", n"*, and l are individually integers having a value of 0 or greater.

In one aspect, the flexible substrate includes a first flexible electrode.

In one aspect, the method further includes disposing a second flexible electrode on the flexible inorganic halide perovskite film, wherein the flexible inorganic halide perovskite film is disposed between the first flexible electrode and the second flexible electrode.

In one aspect, the method further includes disposing at least one adjunct layer between the first flexible electrode and the flexible inorganic halide perovskite film, between the second flexible electrode and the flexible inorganic halide perovskite film, or between both the first flexible electrode and the flexible inorganic halide perovskite film and between the second flexible electrode and the flexible inorganic halide perovskite film, wherein the at least one adjunct layer is selected from the group including a hole transport layer, an electron blocking layer, a buffer layer, an electron transport layer, a hole blocking layer, an electron extraction layer; and combinations thereof.

In one aspect, the photovoltaic device is flexible and visibly transparent.

In one aspect, the method is free from thermally annealing the flexible inorganic halide perovskite film.

In one aspect, the method further includes thermally annealing the flexible inorganic halide perovskite film at a temperature of less than or equal to about 100° C.

In one aspect, the current technology provides a photovoltaic device made by the method.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 6:
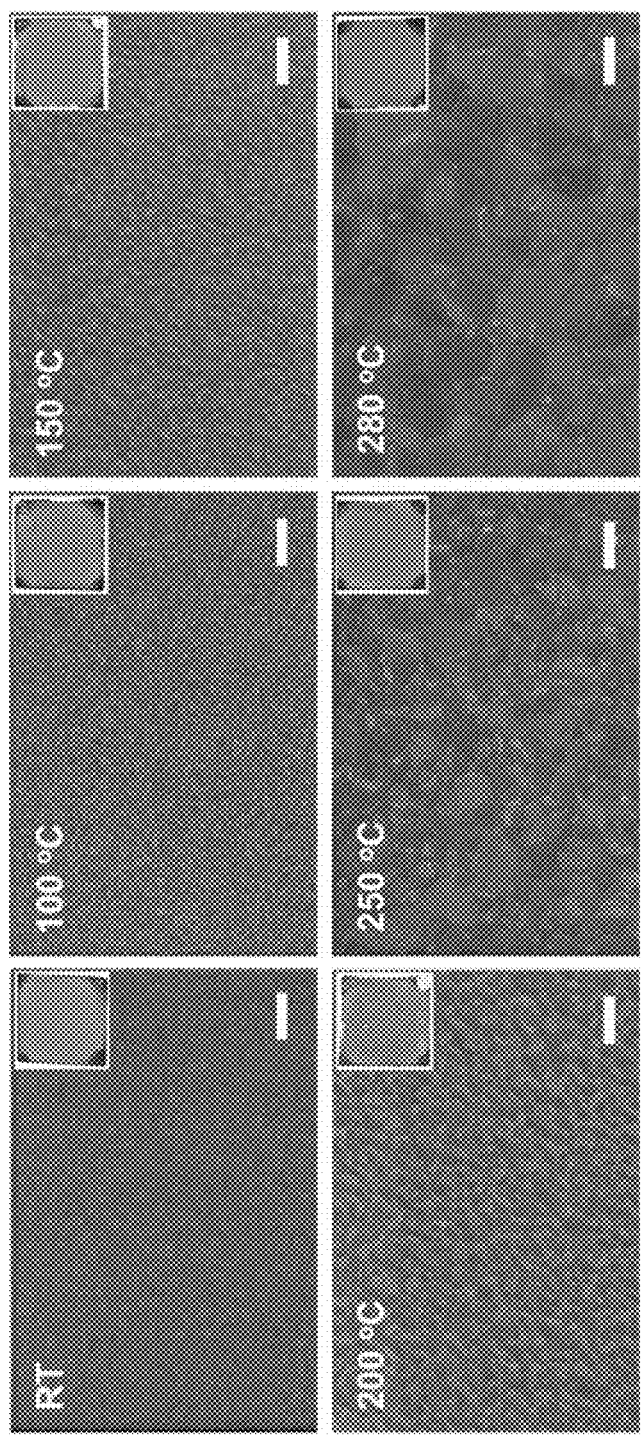

FIG. 6 shows scanning electron micrograph (SEM) images of exemplary CsPbI$_2$Br films with various annealing temperatures. The inset shows the photograph of the films. The scale bar is 1 μm.

Figure 7A:
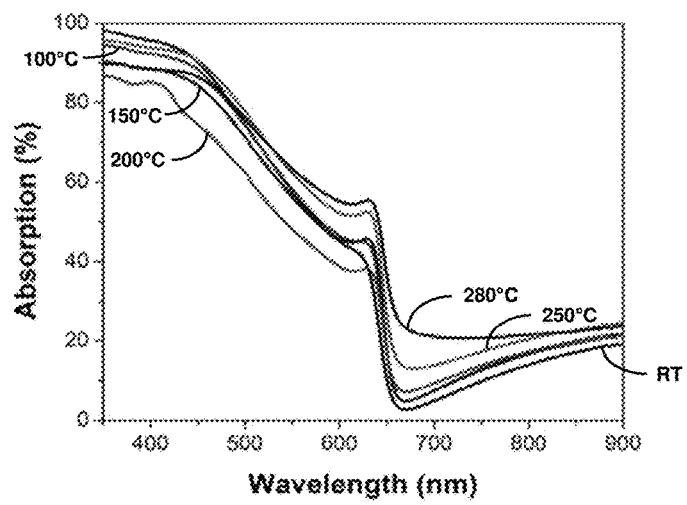

FIG. 7A shows absorption spectra of exemplary CsPbI$_2$Br films with various temperature treatments.

Figure 7B:
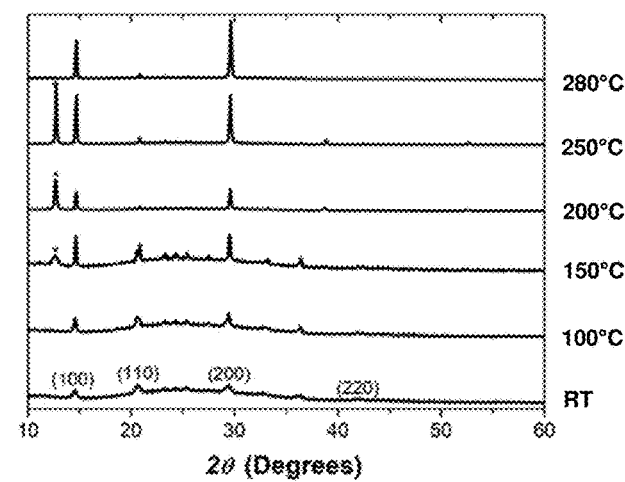

FIG. 7B shows powder X-ray diffraction (XRD) patterns of exemplary CsPbI$_2$Br films with various temperature treatments.

Figure 7C:
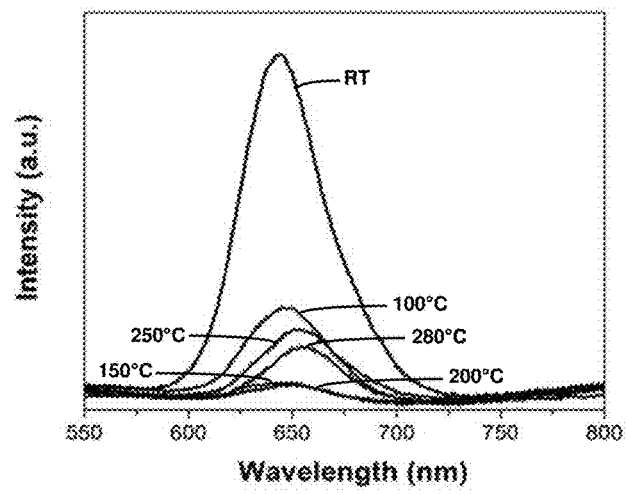

FIG. 7C shows photoluminescence (PL) spectra of exemplary CsPbI$_2$Br films with various temperature treatments.

Figure 8A:
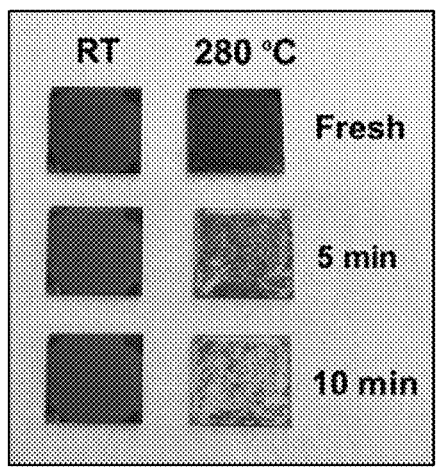

FIG. 8A is a photograph of exemplary CsPbI$_2$Br films stored under ambient air with RH=30±4%. The left row is an exemplary room-temperature film; the right row is an exemplary film with 280° C. annealing treatment.

Figure 8B:
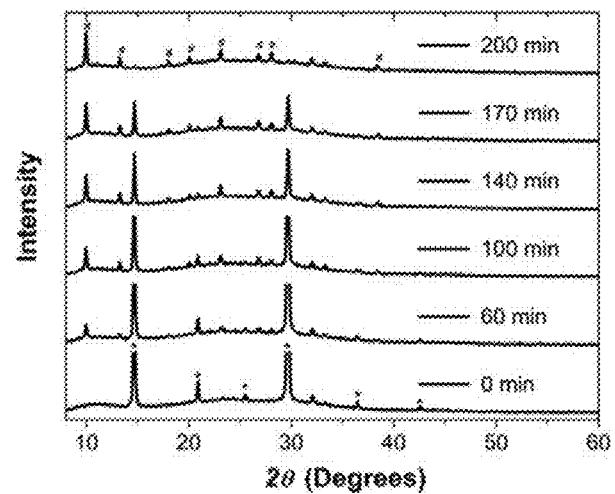

FIG. 8B shows XRD patterns of the exemplary film with 280° C. annealing treatment measured continuously in ambient air with RH=22±4%.

Figure 8C:
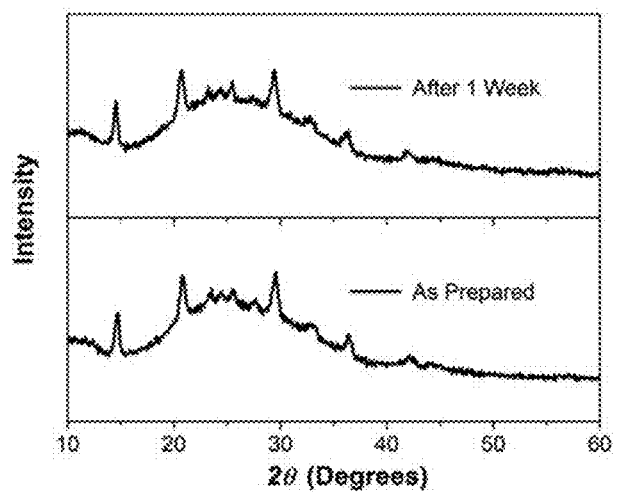

FIG. 8C shows XRD patterns of the exemplary room-temperature film before and after storage in ambient air with RH≤22±4% for a week.

Figure 9A:
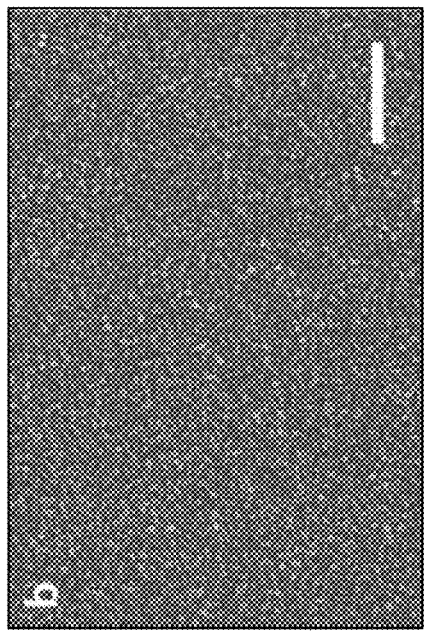
Figure 9B:
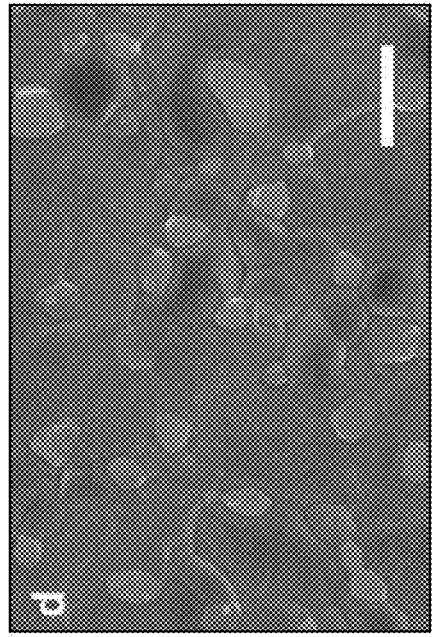
Figure 9C:
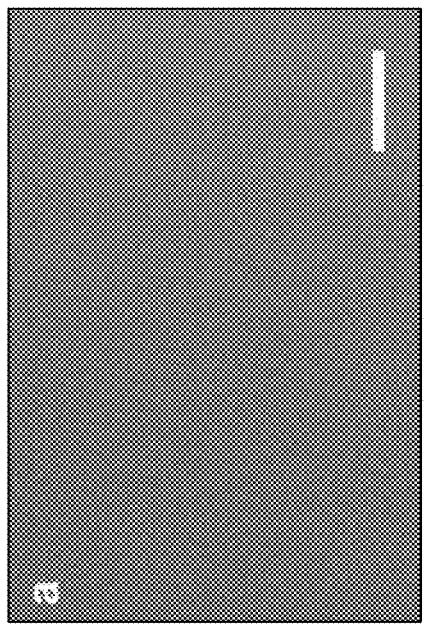
Figure 9D:
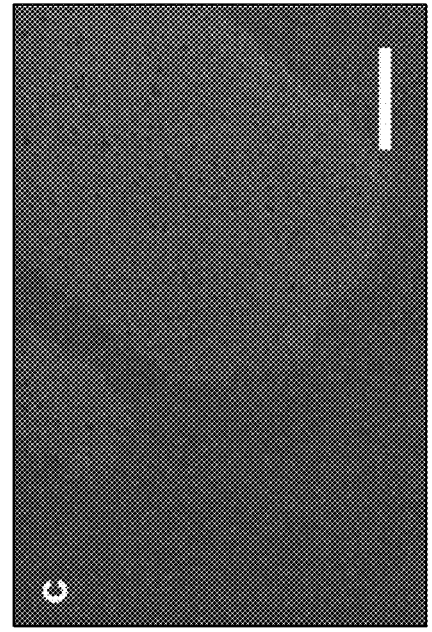

FIGS. 9A-9D are SEM images of an exemplary $CsPbI_2Br$ film stored in ambient air (RH=30±4%) for 5 minutes. FIGS. 9A-9B show the exemplary room temperature $CsPbI_2Br$ film, with a scale bar of 10 µm (FIG. 9A) and 1 µm (FIG. 9B), respectively. FIGS. 9C-9D show the exemplary 280° C. annealing treatment $CsPbI_2Br$ film, with a scale bar of 10 µm (FIG. 9C) and 1 µm (FIG. 9D), respectively.

Figure 10A:
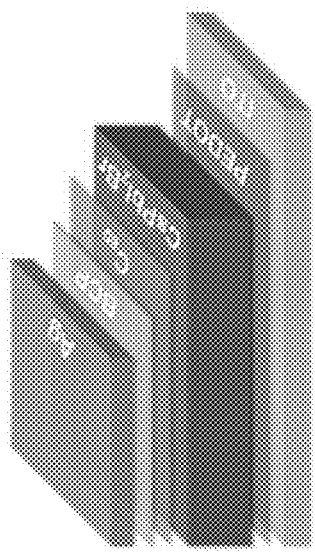

FIG. 10A is an illustration of the architecture of an exemplary PSC device according to various aspects of the current technology.

Figure 10B:
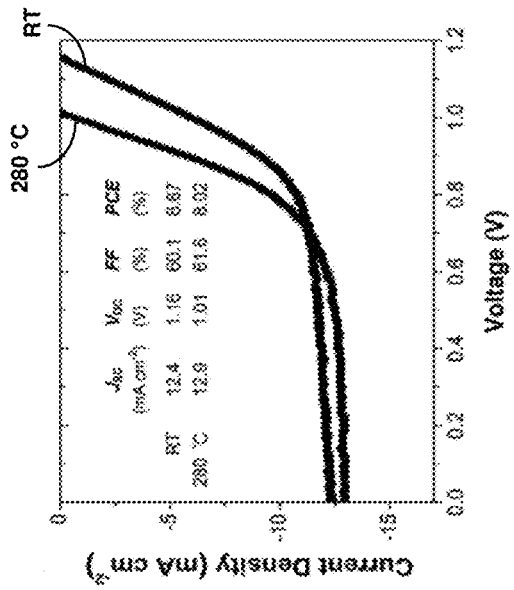

FIG. 10B shows current-voltage (J-V) curves of exemplary perovskite devices with room-temperature $CsPbI_2Br$ film and 280° C. annealing treatment film measured under 1-sun illumination, respectively.

Figure 10C:
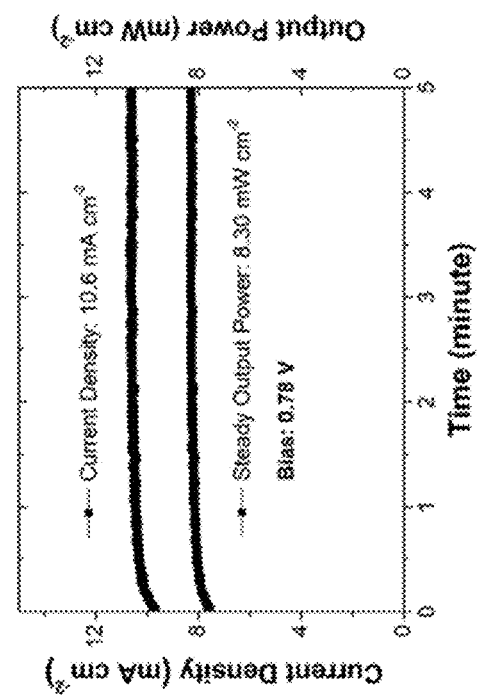

FIG. 10C is a graph of the steady current density and power output under 1-sun illumination at a bias of 0.78 V.

Figure 10D:
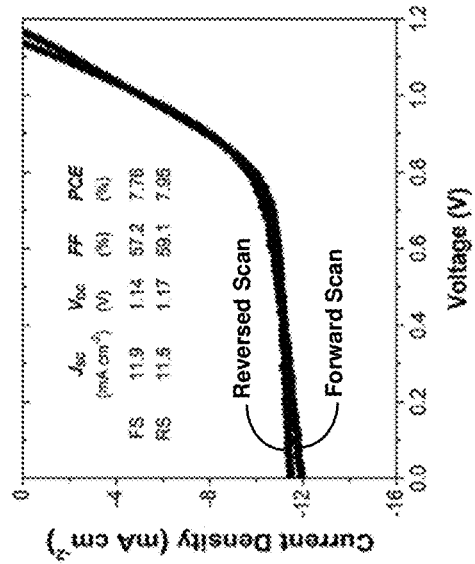

FIG. 10D shows the J-V curves of an exemplary room-temperature processed $CsPbI_2Br$ device measured with reverse and forward bias.

Figure 11:
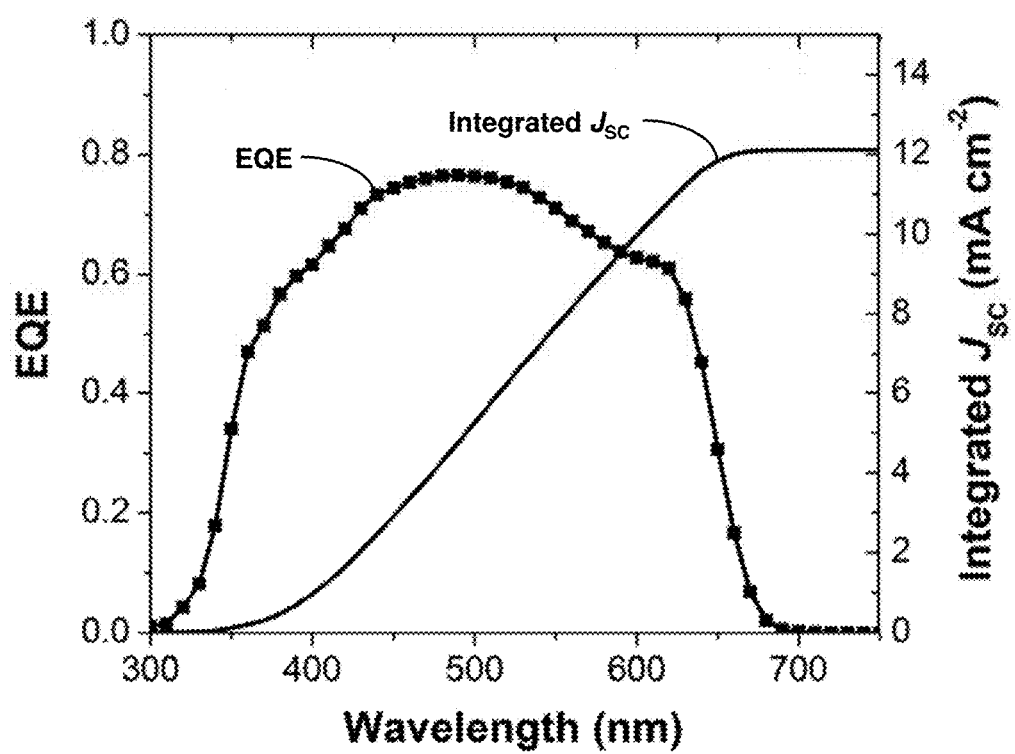

FIG. 11 shows the external quantum efficiency (EQE) spectrum of exemplary room-temperature $CsPbI_2Br$ devices.

Figure 12A:
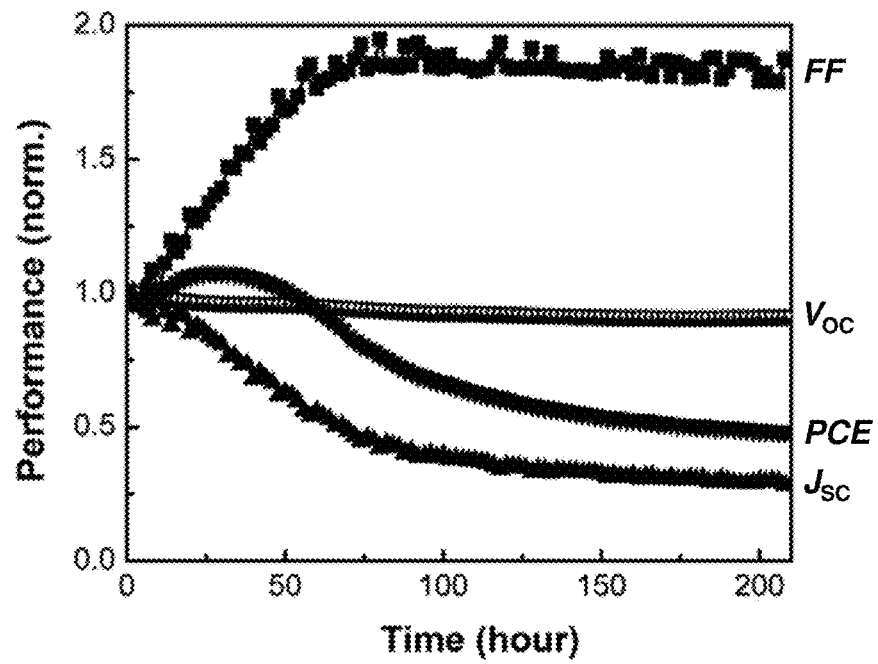
Figure 12B:
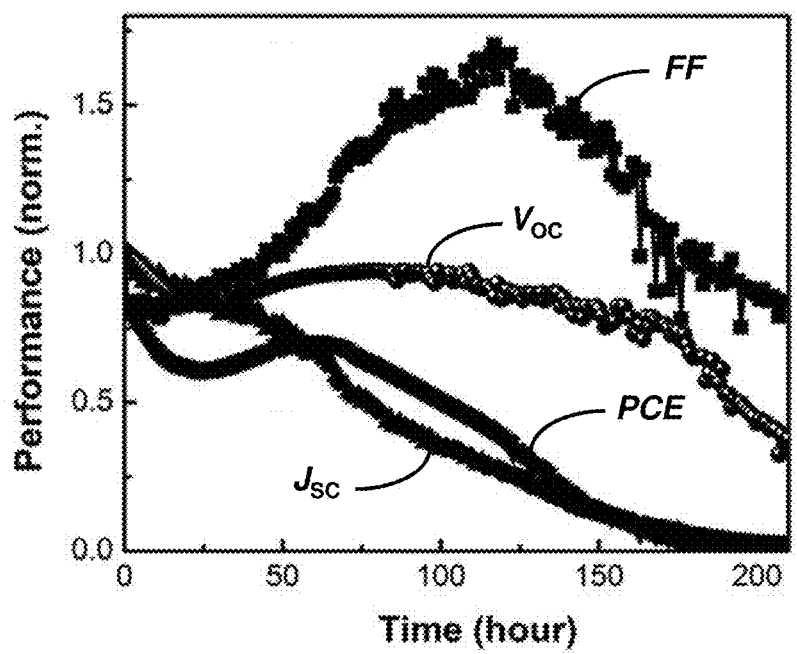

FIGS. 12A-12B are graphs showing initial device stability testing of exemplary inorganic lead halide PSCs for the room temperature processed device (FIG. 12A) and the 280° C.-film device (FIG. 12B) measured under continuous simulated solar illumination (100 mW $cm^{-2}$) at 50° C.

Figure 13A:
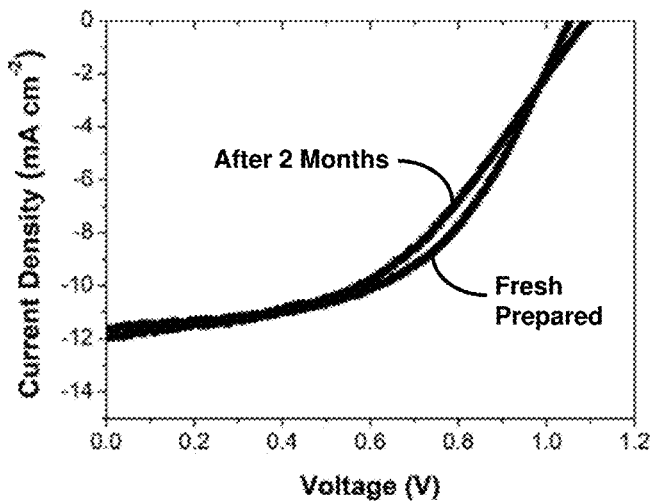

FIG. 13A shows J-V curves of an exemplary flexible $CsPbI_2Br$ device measured before and after 2 months storage in a glovebox without any encapsulation.

Figure 13B:
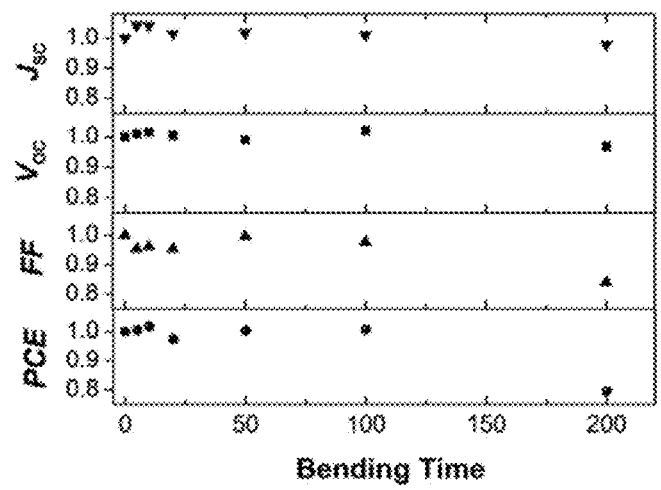

FIG. 13B shows the normalized parameters of exemplary flexible $CsPbI_2Br$ devices under various bending circles with a bending radius of 4.05 mm.

Figure 13C:
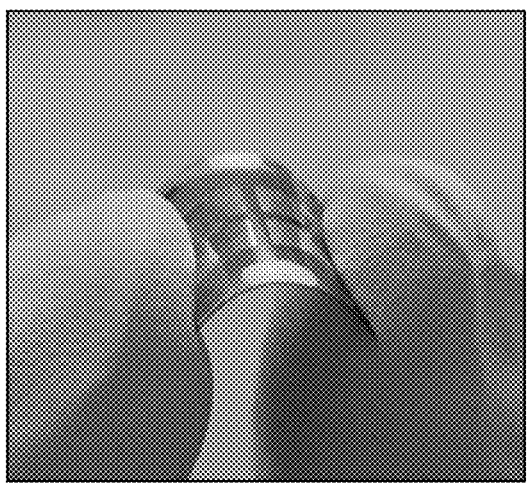

FIG. 13C is a photograph of an exemplary flexible $CsPbI_2Br$ device.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges. As referred to herein, ranges are, unless specified otherwise, inclusive of endpoints and include disclosure of all distinct values and further divided ranges within the entire range. Thus, for example, a range of "from A to B" or "from about A to about B" is inclusive of A and B.

Example embodiments will now be described more fully with reference to the accompanying drawings.

The current technology provides flexible inorganic halide perovskite films and methods of processing such films at room temperature. Flexible inorganic halide perovskite films are generated using vacuum assist without adding exogenous heat. However, the methods can include evaporative cooling that can lower a reaction temperature to below room temperature. Structures and devices made from the flexible inorganic halide perovskite films and associated methods are also provided.

Figure 1:
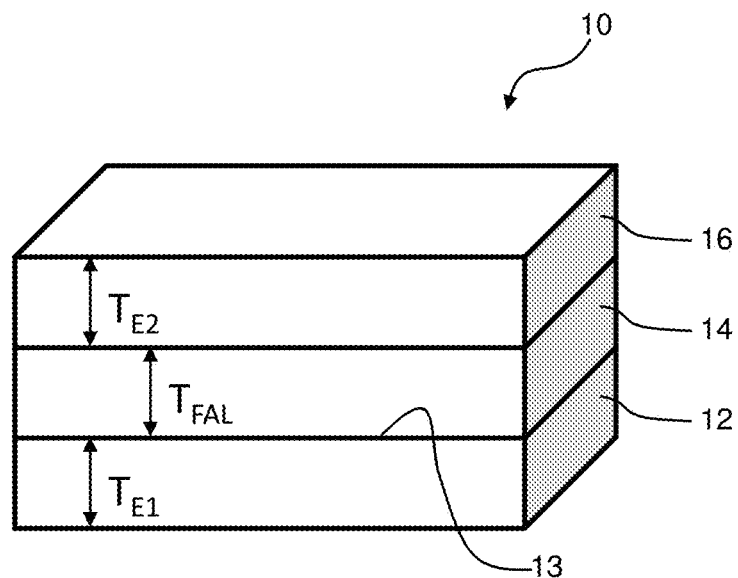
FIG. 1 is an illustration of a first device according to various aspects of the current technology.

With reference to FIG. 1, the current technology provides a photovoltaic device 10. The photovoltaic device 10 comprises a first electrode 12 having an electrically conductive surface 13, an active layer 14, and a second electrode 16. Each of the first electrode 12, the active layer 14, and the second electrode 16 are flexible, such that the photovoltaic device 10 is itself flexible. The active layer 14 is disposed on the electrically conductive surface 13 of the first electrode 12 such that the active layer 14 is located between the first electrode 12 and the second electrode 16.

The active layer 14 comprises a light absorbing material provided as a flexible film, such as a flexible continuous film. The light absorbing material is an inorganic halide perovskite that corresponds to a formula $A_mB_nX_{m+2n}$, $A_mB_nX_{m'+4n'}$, $A_mB_nB'_{n'''}X_{m''+2n''+4n'''*}$, $A_mC_nX_{m+3n}$, $A_mC_nD_lX_{m+3n+l}$, or $(A'X)_mB_nX_{m+2n}$, wherein A is a 1+ alkali metal, a 1+ transition metal, a 1+ lanthanide, a 1+ actinide, or a 1+ compound having the formula A'X, wherein A' is an alkaline earth metal, a 2+ transition metal, a 2+ lanthanide, a 2+ actinide, or a combination thereof; A' is an alkaline earth metal, a 2+ transition metal, a 2+ lanthanide, a 2+ actinide, or a combination thereof; B is a 2+ alkaline earth metal, a 2+ transition metal, a 2+ crystallogen, a 2+ lanthanide, a 2+ actinide, or a combination thereof; B' is a 4+ metal or a combination of 4+ metals; C is a 3+ pnictogen, a 3+ icosagen, a 3+ transition metal, or a combination thereof; D is silver (Ag), copper (Cu), gold (Au), indium (In I), thallium (Tl I), or a combination thereof; X is an inorganic anion or a combination of inorganic anions; and m, m', m'', n, n', n'', n'''*, and l are individually integers having a value of 0 or greater, such as a value of 0, 1, 2, 3, 4, 5, 6, 7, 8, or 9. In various embodiments, A is cesium (Cs), rubidium (Rb), potassium (K), sodium (Na), lithium (Li), copper (Cu I), or a combination thereof; A' is beryllium (Be), magnesium (Mg), calcium (Ca), strontium (Sr), barium (Ba), iron (Fe II), chromium (Cr II), cobalt (Co II), nickel (Ni II), manganese (Mn II), lead (Pb II), copper (Cu II), vanadium (V II), zinc (Zn II), or a combination thereof; B is tin (Sn), lead (Pb), copper (Cu II), germanium (Ge), or a combination thereof; B' is tin (Sn), germanium (Ge), lead (Pb), or a combination thereof; C is bismuth (Bi), antimony (Sb), indium (In III), iron (Fe), aluminum (Al), or a combination thereof; and X is an inorganic anion selected from the group consisting of a halogen (e.g., F, Cl, Br, I, or a combination thereof), an oxalate, a hydroxide, a chlorate, an iodate, a nitrite, a sulfate, a thiosulfate, a phosphate, an antimonite, or a combination thereof. When X is not a halide, it is understood that halide components are then provided from another precursor such that the non-halide X is substantially eliminated from a film during a deposition. The inorganic halide perovskite is free of organic components. In other words, the inorganic halide perovskite does not include organic groups or organic substituents. Therefore, the inorganic halide perovskite is strictly inorganic.

Non-limiting examples of inorganic halide perovskites include $CsSiCl_3$, $CsSiBr_3$, $CsSiI_3$, $RbSiCl_3$, $RbSiBr_3$, $KSiCl_3$, $KSiBr_3$, $KSiI_3$, $Cs_2SiCl_4$, $Cs_2SiBr_4$, $Cs_2SiI_4$, $Rb_2SiCl_4$, $Rb_2SiBr_4$, $Rb_2SiI_4$, $CsSi_2Cl_5$, $Cs_2SiCl_6$, $Cs_2Si(II)Si(IV)Cl_8$, $CsSi_2Br_5$, $Cs_2SiBr_6$, $Cs_2Si(II)Si(IV)Br_8$, $CsSi_2I_5$, $Cs_2SiI_6$, $Cs_2Si(II)Si(IV)I_8$, $RbSi_2Cl_5$, $Rb_2SiCl_6$, $Rb_2Si(II)Si(IV)Cl_8$, $RbSi_2Br_5$, $Rb_2SiBr_6$, $Rb_2Si(II)Si(IV)Br_8$, $RbSi_2I_5$, $Rb_2SiI_6$, $Rb_2Si(II)Si(IV)I_8$, $KSi_2Cl_5$, $K_2SiCl_6$, $K_2Si(II)Si(IV)Cl_8$, $KSi_2Br_5$, $K_2SiBr_6$, $K_2Si(II)Si(IV)Br_8$, $KSi_2I_5$, $K_2SiI_6$, $K_2Si(II)Si(IV)I_8$, $CsGeCl_3$, $CsGeBr_3$, $CsGeI_3$, $RbGeCl_3$, $RbGeBr_3$, $KGeCl_3$, $KGeBr_3$, $KGeI_3$, $Cs_2GeCl_4$, $Cs_2GeBr_4$, $Cs_2GeI_4$, $Rb_2GeCl_4$, $Rb_2GeBr_4$, $Rb_2GeI_4$, $CsGe_2Cl_5$, $Cs_2GeCl_6$, $Cs_2Ge(II)Ge(IV)Cl_8$, $CsGe_2Br_5$, $Cs_2GeBr_6$, $Cs_2Ge(II)Ge(IV)Br_8$, $CsGe_2I_5$, $Cs_2GeI_6$, $Cs_2Ge(II)Ge(IV)I_8$, $RbGe_2Cl_5$, $Rb_2GeCl_6$, $Rb_2Ge(II)Ge(IV)Cl_8$, $RbGe_2Br_5$, $Rb_2GeBr_6$, $Rb_2Ge(II)Ge(IV)Br_8$, $RbGe_2I_5$, $Rb_2GeI_6$, $Rb_2Ge(II)Ge(IV)I_8$, $KGe_2Cl_5$, $K_2GeCl_6$, $K_2Ge(II)Ge(IV)Cl_8$, $KGe_2Br_5$, $K_2GeBr_6$, $K_2Ge(II)Ge(IV)Br_8$, $KGe_2I_5$, $K_2GeI_6$, $K_2Ge(II)Ge(IV)I_8$, $CsSnCl_3$, $CsSnBr_3$, $CsSnI_3$, $RbSnCl_3$, $RbSnBr_3$, $KSnCl_3$, $KSnBr_3$, $KSnI_3$, $Cs_2SnCl_4$, $Cs_2SnBr_4$, $Cs_2SnI_4$, $Rb_2SnCl_4$, $Rb_2SnBr_4$, $Rb_2SnI_4$, $CsSn_2Cl_5$, $Cs_2SnCl_6$, $Cs_2Sn(II)Sn(IV)Cl_8$, $CsSn_2Br_5$, $Cs_2SnBr_6$, $Cs_2Sn(II)Sn(IV)Br_8$, $CsSn_2I_5$, $Cs_2SnI_6$, $Cs_2Sn(II)Sn(IV)I_8$, $RbSn_2Cl_5$, $Rb_2SnCl_6$, $Rb_2Sn(II)Sn(IV)Cl_8$, $RbSn_2Br_5$, $Rb_2SnBr_6$, $Rb_2Sn(II)Sn(IV)Br_8$, $RbSn_2I_5$, $Rb_2SnI_6$, $Rb_2Sn(II)Sn(IV)I_8$, $KSn_2Cl_5$, $K_2SnCl_6$, $K_2Sn(II)Sn(IV)Cl_8$, $KSn_2Br_5$, $K_2SnBr_6$, $K_2Sn(II)Sn(IV)Br_8$, $KSn_2I_5$, $K_2SnI_6$, $K_2Sn(II)Sn(IV)I_8$, $Cs_3Bi_2Cl_9$, $Cs_3Bi_2Br_9$, $Cs_3Bi_2I_9$, $Cs_3Sb_2Cl_9$, $Cs_3Sb_2Br_9$, $Cs_3Sb_2I_9$, $CsPbCl_3$, $CsPbBr_3$, $CsPbI_3$, $CsPbI_2Br$, $CsPbIBr_2$, $Cs_2TiCl_6$, $Cs_2TiBr_6$, $Cs_2TiI_6$, $Cs_2TiCl_3Br_3$, $Cs_2TiCl_3I_3$, $Cs_2TiBr_3I_3$, $Cs_2TiCl_2Br_4$, $Cs_2TiCl_2I_4$, $Cs_2TiCl_4Br_2$, $Cs_2TiCl_4I_2$, $Cs_2TiBr_2I_4$, $Cs_2TiBr_4I_2$, $RbPbCl_3$, $RbPbBr_3$, $KPbCl_3$, $KPbBr_3$, $KPbI_3$, $Cs_2PbCl_4$, $Cs_2PbBr_4$, $Cs_2PbI_4$, $Rb_2PbCl_4$, $Rb_2PbBr_4$, $Rb_2PbI_4$, $CsPb_2Cl_5$, $Cs_2PbCl_6$, $Cs_2Pb(II)Pb(IV)Cl_8$, $CsPb_2Br_5$, $Cs_2PbBr_6$, $Cs_2Pb(II)Pb(IV)Br_8$, $CsPb_2I_5$, $Cs_2PbI_6$, $Cs_2Pb(II)Pb(IV)I_8$, $RbPb_2Cl_5$, $Rb_2PbCl_6$, $Rb_2Pb$ (II)Pb(IV)Cl$_8$, RbPb$_2$Br$_5$, Rb$_2$PbBr$_6$, Rb$_2$Pb(II)Pb(IV)Br$_8$, RbPb$_2$I$_5$, Rb$_2$PbI$_6$, Rb$_2$Pb(II)Pb(IV)I$_8$, KPb$_2$Cl$_5$, K$_2$PbCl$_6$, K$_2$Pb(II)Pb(IV)Cl$_8$, KPb$_2$Br$_5$, K$_2$PbBr$_6$, K$_2$Pb(II)Pb(IV)Br$_8$, KPb$_2$I$_5$, K$_2$PbI$_6$, K$_2$Pb(II)Pb(IV)I$_8$, Cs$_2$AgBiCl$_6$, Cs$_2$CuBiCl$_6$, Cs$_2$InAgCl$_6$, Cs$_2$InCuCl$_6$, Cs$_2$AgSbCl$_6$, Cs$_2$CuSbCl$_6$, Cs$_2$AgBiBr$_6$, Cs$_2$CuBiBr$_6$, Cs$_2$InAgBr$_6$, Cs$_2$InCuBr$_6$, Cs$_2$AgBiI$_6$, Cs$_2$CuBiI$_6$, Cs$_2$AgSbBr$_6$, Cs$_2$CuSbBr$_6$, Cs$_2$AgSbI$_6$, Cs$_2$CuSbI$_6$, Cs$_2$InAgI$_6$, Cs$_2$InCuI$_6$, Cs$_3$Bi$_2$Cl$_9$, Cs$_3$Bi$_2$Br$_9$, Cs$_3$Bi$_2$I$_9$, Cs$_3$Sb$_2$Cl$_9$, Cs$_3$Sb$_2$Br$_9$, Cs$_3$Sb$_2$I$_9$, Cs$_3$In$_2$Cl$_9$, Cs$_3$In$_2$Br$_9$, Cs$_3$In$_2$I$_9$, K$_2$AgBiCl$_6$, K$_2$CuBiCl$_6$, K$_2$InAgCl$_6$, K$_2$InCuCl$_6$, K$_2$AgSbCl$_6$, K$_2$CuSbCl$_6$, K$_2$AgBiBr$_6$, K$_2$CuBiBr$_6$, K$_2$InAgBr$_6$, K$_2$InCuBr$_6$, K$_2$AgBiI$_6$, K$_2$CuBiI$_6$, K$_2$AgSbBr$_6$, K$_2$CuSbBr$_6$, K$_2$AgSbI$_6$, K$_2$CuSbI$_6$, K$_2$InAgI$_6$, K$_2$InCuI$_6$, K$_3$Bi$_2$Cl$_9$, K$_3$Bi$_2$Br$_9$, K$_3$Bi$_2$I$_9$, K$_3$Sb$_2$Cl$_9$, K$_3$Sb$_2$Br$_9$, K$_3$Sb$_2$I$_9$, K$_3$In$_2$Cl$_9$, K$_3$In$_2$Br$_9$, K$_3$In$_2$I$_9$, Na$_2$AgBiCl$_6$, Na$_2$CuBiCl$_6$, Na$_2$InAgCl$_6$, Na$_2$InCuCl$_6$, Na$_2$AgSbCl$_6$, Na$_2$CuSbCl$_6$, Na$_2$AgBiBr$_6$, Na$_2$CuBiBr$_6$, Na$_2$InAgBr$_6$, Na$_2$InCuBr$_6$, Na$_2$AgBiI$_6$, Na$_2$CuBiI$_6$, Na$_2$AgSbBr$_6$, Na$_2$CuSbBr$_6$, Na$_2$AgSbI$_6$, Na$_2$CuSbI$_6$, Na$_2$InAgI$_6$, Na$_2$InCuI$_6$, Na$_3$Bi$_2$Cl$_9$, Na$_3$Bi$_2$Br$_9$, Na$_3$Bi$_2$I$_9$, Na$_3$Sb$_2$Cl$_9$, Na$_3$Sb$_2$Br$_9$, Na$_3$Sb$_2$I$_9$, Na$_3$In$_2$Cl$_9$, Na$_3$In$_2$Br$_9$, Na$_3$In$_2$I$_9$, Li$_2$AgBiCl$_6$, Li$_2$CuBiCl$_6$, Li$_2$InAgCl$_6$, Li$_2$InCuCl$_6$, Li$_2$AgSbCl$_6$, Li$_2$CuSbCl$_6$, Li$_2$AgBiBr$_6$, Li$_2$CuBiBr$_6$, Li$_2$InAgBr$_6$, Li$_2$InCuBr$_6$, Li$_2$AgBiI$_6$, Li$_2$CuBiI$_6$, Li$_2$AgSbBr$_6$, Li$_2$CuSbBr$_6$, Li$_2$AgSbI$_6$, Li$_2$CuSbI$_6$, Li$_2$InAgI$_6$, Li$_2$InCuI$_6$, Li$_3$Bi$_2$Cl$_9$, Li$_3$Bi$_2$Br$_9$, Li$_3$Bi$_2$I$_9$, Li$_3$Sb$_2$Cl$_9$, Li$_3$Sb$_2$Br$_9$, Li$_3$Sb$_2$I$_9$, Li$_3$In$_2$Cl$_9$, Li$_3$In$_2$Br$_9$, Li$_3$In$_2$I$_9$, and combinations thereof.

In various embodiments, the active layer 14 comprising the inorganic halide perovskite further comprises a dopant. The dopant can be, for example, a p-type dopant or an n-type dopant. Non-limiting examples of dopants include BF$_3$, BCl$_3$, BBr$_3$, BI$_3$, B$_2$S$_3$, AlF$_3$, AlCl$_3$, AlBr$_3$, AlI$_3$, Al$_2$S$_3$, GaF$_3$, GaCl$_3$, GaBr$_3$, GaI$_3$, Ga$_2$S$_3$, MnF$_3$, MnF$_4$, MnCl$_2$, MnCl$_3$, MnBr$_2$, MnI$_2$, FeF$_2$, FeF$_3$, FeCl$_3$, FeCl$_2$, FeBr$_2$, FeBr$_3$, FeI$_2$, FeI$_3$, CoF$_2$, CoF$_3$, CoF$_4$, CoCl$_2$, CoCl$_3$, CoBr$_2$, CoI$_2$, NiF$_2$, NiCl$_2$, NiI$_2$, CrF$_2$, CrF$_3$, CrF$_4$, CrF$_5$, CrF$_6$, CrCl$_2$, CrCl$_3$, CrCl$_4$, CrBr$_2$, CrBr$_3$, CrBr$_4$, CrI$_2$, CrI$_3$, CrI$_4$, VF$_2$, VF$_3$, VF$_4$, VF$_6$, VCl$_2$, VCl$_3$, VCl$_4$, VBr$_2$, VBr$_3$, VBr$_4$, VI$_2$, VI$_3$, VI$_4$, CuF, CuF$_2$, CuCl, CuCl$_2$, CuBr$_2$, CuI, BaF$_2$, BaCl$_2$, BaBr$_2$, BaI$_2$, BiF$_3$, BiCl$_3$, BiBr$_3$, BiI$_3$, SnF$_4$, SnCl$_4$, SnBr$_4$, SnI$_4$, SiF$_4$, SiCl$_4$, SiBr$_4$, SiI$_4$, SnO, SnS, SnSe, SnTe, GeO, GeS, GeSe, GeTe, PbO, PbS, PbSe, PbTe, and combinations thereof. The dopant has a concentration in the active layer 14 of greater than or equal to about 0.00001% (weight) to 10% (weight), of greater than or equal to about 0.001% (weight) to 15% (weight), or of greater than or equal to about 0.1% (weight) to 1% (weight).

In one embodiment, the active layer 14 is flexible and comprises the inorganic halide perovskite. In another embodiment, the active layer 14 is flexible and comprises the inorganic halide perovskite and at least one dopant. In yet another embodiment, the active layer 14 is flexible and consists essentially of the inorganic halide perovskite and optionally at least one dopant. By "consists essentially of" it is meant that the active layer 14 includes only the inorganic halide perovskite and optional at least one dopant as active materials; however, the active layer 14 may include impurities that do not detectably affect the activity of the inorganic halide perovskite, wherein the impurities are present in the active layer 14 at a concentration of less than or equal to about 10 wt. % of the active layer 14. The active layer 14 comprising the inorganic halide perovskite is flexible and has a thickness $T_{FAL}$ of greater than or equal to about 1 pm to less than or equal to about 2 μm, or greater than or equal to about 1 nm to less than or equal to about 1 μm.

The flexible inorganic halide perovskite, provided as a thin film, has an average grain size of less than or equal to about 500 nm, less than or equal to about 400 nm, less than or equal to about 300 nm, less than or equal to about 200 nm, less than or equal to about 100 nm, or less than or equal to about 50 nm. Moreover, the flexible inorganic halide perovskite has a bend radius of greater than or equal to about 1 mm to less than or equal to about 100 mm, greater than or equal to about 2 mm to less than or equal to about 50 mm, or greater than or equal to about 3 mm to less than or equal to about 10 mm.

In various embodiments, the flexible inorganic halide perovskite has a strongest peak absorbance of light at a wavelength of less than or equal to about 450 nm. In other words, the flexible inorganic halide perovskite can have a bandgap of greater than or equal to about 2.7 eV. In one embodiment, the flexible inorganic halide perovskite has a bandgap of greater than or equal to about 2.75 eV and less than or equal to about 3.2 eV. Accordingly, in some embodiments the flexible inorganic halide perovskite is highly transparent, i.e., has a strongest peak absorbance in the UV and an average visible transmittance of greater than or equal to about 70%.

In FIG. 1, the first electrode 12 is a substrate for the formation of the active layer 14. Therefore, the first electrode 12 can be a monolithic substrate that is electrically conductive, including the electrically conductive surface 13. The first electrode 12 and the second electrode 16 are independently a flexible anode and a flexible cathode. The first and second electrodes 12, 16 comprise a conducting material individually selected from the group consisting of a conducting oxide, such as indium tin oxide (ITO), aluminum doped zinc oxide (AZO), fluorine doped tin oxide (FTO), indium zinc oxide, InZnAlO (IZAO, e.g., 90 wt. % In$_2$O$_3$, 5 wt. % ZnO, and 5 wt. % Al$_2$O$_3$), InAlZnSnO (IZATO), zinc oxide, ZnAlO (ZAO), cadmium oxide, zirconium indium oxide (ZrIO), and gallium zinc oxide (GZO); a metal, such as Al, Au, Ag, Mo, Cu, or Ni, carbon, graphene, graphene oxide, and poly(3,4-ethylenedioxythiophene) polystyrene sulfonate (PEDOT:PSS); and combinations thereof, as non-limiting examples.

The first electrode 12 has a thickness $T_{E1}$ and the second electrode 16 has a thickness $T_{E2}$, wherein thickness $T_{E1}$ and thickness $T_{E2}$ are individually and independently greater than or equal to about 1 nm to less than or equal to about 200 nm, greater than or equal to about 5 nm to less than or equal to about 100 nm, or greater than or equal to about 10 nm to less than or equal to about 75 nm.

Figure 2:
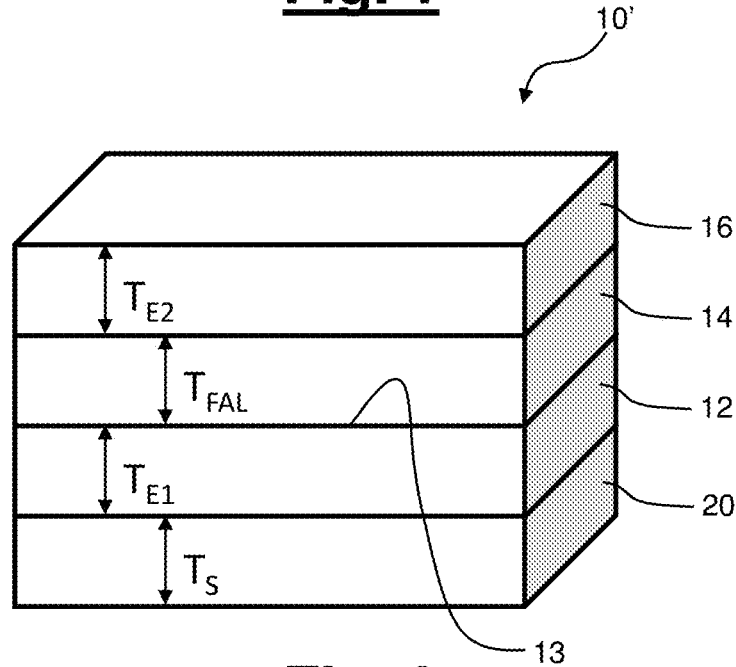
FIG. 2 is an illustration of a second device according to various aspects of the current technology.
Figure 3:
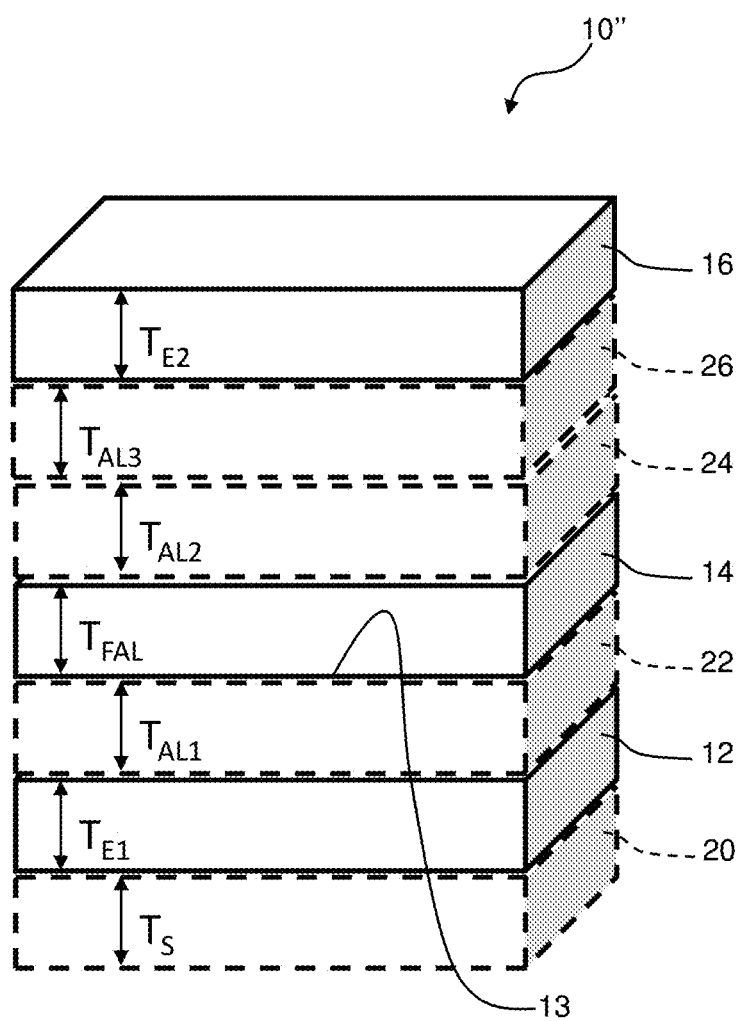
FIG. 3 is an illustration of a third device according to various aspects of the current technology.

In some embodiments, the first electrode 12, rather than being a substrate, is disposed on a substrate. For example, FIG. 2 shows a second photovoltaic device 10', which has the same first electrode 12, active layer 14, and second electrode 16 as the photovoltaic device 10 of FIG. 1. However, the first electrode 12 of the second photovoltaic device 10' is disposed on a substrate 20. Accordingly, in some embodiments, the substrate 20 comprises an electrically non-conductive portion, the electrically conductive first electrode 12, and the electrically conductive surface 13. The substrate 20 is flexible and comprises an electrically non-conductive material, such as glass, low iron glass, plastic, poly(methyl methacrylate) (PMMA), poly-(ethylmethacrylate) (PEMA), (poly)-butyl methacrylate-co-methyl methacrylate (PBMMA), polyethylene terephthalate (PET), polycarbonate, polyimides, such as Kapton® polyimide films (DuPont, Wilmington, DE), and combinations thereof as non-limiting examples. Here, the first electrode 12 is disposed on the substrate 20, and the active layer 14 is disposed on the electrically conductive surface 13 of the first electrode 12. The substrate 20 has a thickness Ts of less than or equal to about 5 mm, less than or equal to about 1 mm, less than or equal to about 500 µm, less than or equal to about 100 µm, less than or equal to about 10 µm, such as from greater than or equal to about 500 µm to less than or equal to about 5 mm FIG. 3 shows a third photovoltaic device 10″, which has the same first electrode 12, active layer 14, and second electrode 16 as the photovoltaic device 10 of FIG. 1. The third photovoltaic device 10″ optionally includes a substrate 20 as described with reference to FIG. 2. However, the third photovoltaic device 10″ further comprises at least one optional adjunct layer. For example, in FIG. 3, the third photovoltaic device 10″ is shown with an optional first adjunct layer 22 disposed between the first electrode 12 and the active layer 14, an optional second adjunct layer 24 located between the active layer 14 and the second electrode 16, and an optional third adjunct layer 26 located between the optional second adjunct layer 24 and the second electrode 16. The adjunct layers 22, 24, 26 are flexible and can individually be a hole transport layer, an electron blocking layer, a buffer layer, an electron transport layer, a hole blocking layer, or an electron extraction layer.

In various embodiments, the third photovoltaic device 10″ comprises the optional first adjunct layer 22 as a hole transport layer/work function modifying layer/buffer layer/hole selective layer, wherein work function modifying layers are added to get a wetting. Here, the optional first adjunct layer 22 comprises poly(3,4-ethylenedioxythiophene) polystyrene sulfonate (PEDOT:PSS), poly(3-hexylthiophene-2,5-diyl) (P3HT), N,N'-Bis(naphthalen-1-yl)-N,N'-bis(phenyl)-2,2'-dimethylbenzidine (NPD), N,N'-Bis(3-methylphenyl)-N,N'-bis(phenyl)-benzidine (TPD), 2,2',7,7'-Tetrakis(N,N-diphenylamino)-2,7-diamino-9,9-spirobifluorene (spiro-TAD), Poly[N,N'-bis(4-butylphenyl)-N,N'-bis(phenyl)-benzidine] (poly-TPD), CuSCN, CuI, MoO$_3$, NiO, or a combination thereof.

In various embodiments, the third photovoltaic device 10″ comprises the optional second adjunct layer 24 as an electron transport layer/electron extraction layer. Here, the optional second adjunct layer 24 comprises a fullerene, such as C$_{60}$, C$_{70}$, C$_{84}$, or phenyl-C$_{61}$-butyric-acid-methyl-ester (PCBM), ZnO, TiO$_2$, NiO, MoO$_3$, nanotubes, conductive nanoparticles (e.g., TIO), or a combination thereof. For example, the role of fullerenes in perovskite solar cells is typically to aid in electron extraction, and therefore, layers should be as thin as possible to prevent tail state absorption: less than or equal to about 40 nm, less than or equal to about 20 nm, less than or equal to about 10 nm, less than or equal to about 5 nm, or less than or equal to about 1 nm.

In various embodiments, the third photovoltaic device 10″ comprises the optional third adjunct layer 26 as an electron transport layer/electron extraction layer/buffer layer/hole blocking layer. The optional third adjunct layer 26 provides an ohmic contact between the active layer 14 and the second electrode 16. Here, the optional third adjunct layer 26 comprises [6,6]-phenyl-C61-butyric acid methyl ester (PCBM), Al-doped ZnO (AZO), TiO$_2$, bathocuproine (BCP), MoO$_3$, or a combination thereof.

The optional first adjunct layer 22 has a thickness $T_{AL1}$, the optional second adjunct layer 24 has a thickness $T_{AL2}$, and the optional third adjunct layer 26 has a thickness $T_{AL3}$. $T_{AL1}$, $T_{AL2}$, and $T_{AL3}$ are independently and individually greater than or equal to about 0.05 nm to less than or equal to about 200 nm, greater than or equal to about 1 nm to less than or equal to about 100 nm, or greater than or equal to about 5 nm to less than or equal to about 75 nm.

When the third photovoltaic device 10″ comprises an adjunct layer 22, 24, 26 that is an electron transport layer or a hole transport layer, the electrode 12, 16 that is located adjacent to the electron transport layer is the cathode and the electrode 12, 16 that is adjacent to the hole transport layer is the anode.

In various embodiments, the third photovoltaic device 10″ comprises at least one flexible adjunct layer 22, 24, 26 selected from the group consisting of a hole transport layer, an electron blocking layer, a buffer layer, an electron transport layer, a hole blocking layer, an electron extraction layer; and combinations thereof, wherein the at least one flexible adjunct layer 22, 24, 26 is disposed between the first metallic electrode 12 and the active layer 14 comprising the flexible inorganic halide perovskite, between the second metallic electrode 16 and the active layer 14 comprising the flexible inorganic halide perovskite, or between both the first metallic electrode 12 and the active layer 14 comprising the flexible inorganic halide perovskite and between the second metallic electrode 16 and the active layer 14 comprising the flexible inorganic halide perovskite.

Figure 4:
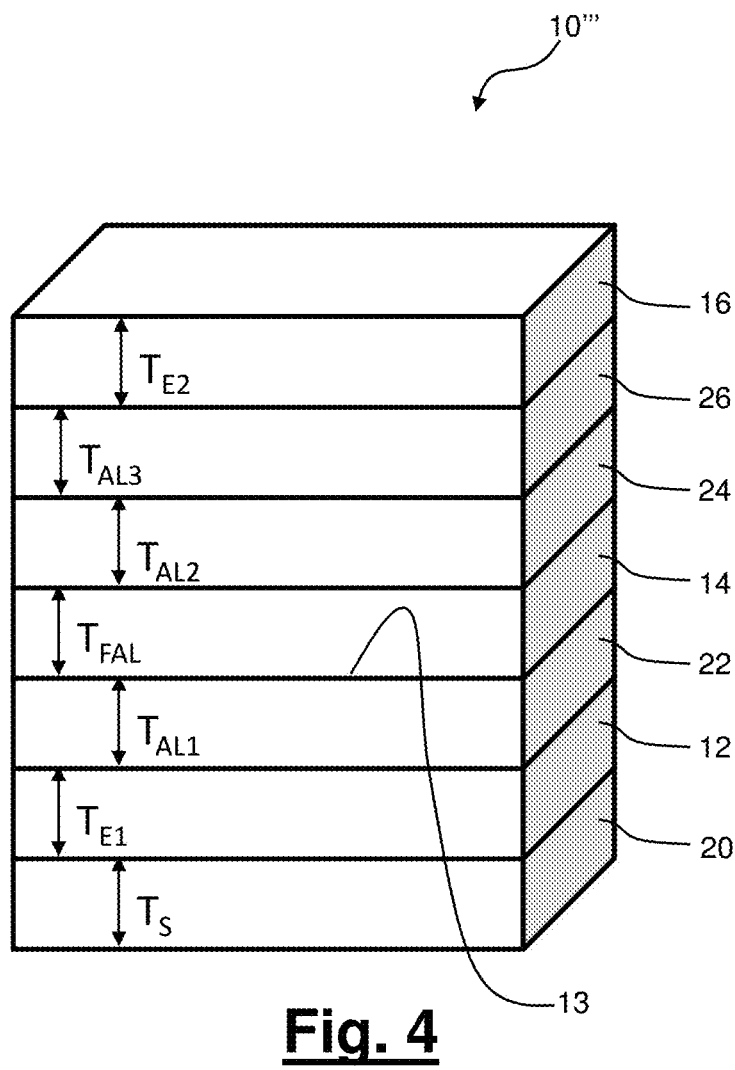
FIG. 4 is an illustration of a fourth device according to various aspects of the current technology.

FIG. 4 shows a fourth photovoltaic device 10‴. The fourth photovoltaic device 10‴ comprises every layer described in relation to FIGS. 1-3. In particular, the fourth photovoltaic device 10‴ sequentially comprises the substrate 20, the first electrode 12, the first adjunct layer 22, the active layer 14, the second adjunct layer 24, the third adjunct layer 26, and the second electrode 16. Here, the first adjunct layer 22 is a hole transport layer and the second adjunct layer 24 is an electron transport layer. Therefore, the first electrode 12 is an anode and the second electrode 16 is a cathode. It is understood that each of the layers 12, 14, 16, 18, 20, 22, 24, 26 is flexible. It is also understood that any of the photovoltaic devices 10, 10', 10″, 10‴ described herein can further comprise additional active layers and additional adjunct layers.

In various embodiments, the photovoltaic devices of the current technology, including the photovoltaic devices 10, 10', 10″, 10‴ of FIGS. 1-4, are flexible and are comprised of a plurality of layers, each of which can be visibly transparent, i.e., having an average visible transmittance of greater than or equal to about 75%. Moreover, each of the plurality of layers can be flexible such that the photovoltaic devices have a bend radius of greater than or equal to about 1 mm to less than or equal to about 100 mm, greater than or equal to about 2 mm to less than or equal to about 50 mm, or greater than or equal to about 3 mm to less than or equal to about 10 mm.

The photovoltaic devices of the current technology, including the photovoltaic devices 10, 10', 10″, 10‴ of FIGS. 1-4, have a power conversion efficiency (PCE) of greater than or equal to about 5%, greater than or equal to about 6%, greater than or equal to about 6.5%, greater than or equal to about 10%, greater than or equal to about 15%, greater than or equal to about 20%, greater than or equal to about 25%, or greater than or equal to about 30%. The photovoltaic devices also have an external quantum efficiency (EQE) of greater than or equal to about 10%, greater than or equal to about 25%, greater than or equal to about 50%, or greater than or equal to about 75%.

The current technology also provides a method of fabricating a flexible inorganic halide perovskite. The method comprises disposing a precursor solution on a substrate. The disposing can be performed by any method known in the art, such as, by spin coating, dip coating, doctor blading, drop casting, spray coating, and combinations thereof as non-limiting examples. The precursor solution comprises a first perovskite precursor and a second perovskite precursor dissolved in a solvent. In some embodiments, the precursor solution further comprises a dopant dissolved in the solvent, wherein the dopant is any dopant described herein. The substrate can be any substrate described herein, including a flexible monolithic substrate that is electrically conductive or a flexible substrate comprising an electrically non-conductive portion or layer and a flexible electrically conductive portion or layer, wherein the electrically conductive portion provides an electrically conductive surface on which the precursor solution is applied. Accordingly, the flexible substrate comprises a first flexible electrode.

The method then comprises applying a negative pressure to the precursor solution to remove the solvent. The subjecting the precursor solution to a negative pressure comprises subjecting the precursor solution to a negative pressure of greater than or equal to about 1 mTorr to less than or equal to about 1500 mTorr for a time period of greater than or equal to about 5 seconds to less than or equal to about 24 hours, such as a time period of about 5 s, about 30 s, about 1 min, about 2 min, about 3 min, about 4 min, about 5 min, about 6 min, about 7 min, about 8 min, about 9 min, about 10 min, about 15 min, about 20 min, about 30 min, about 40 min, about 45 min, about 1 hr, about 2 hr, about 4 hr, about 6 hr, about 8 hr, about 10 hr, about 12 hr, about 14 hr, about 16 hr, about 18 hr, about 20 hr, about 22 hr, about 24 hr, or any time in between. The negative pressure is applied, for example, by performing a vacuum-assist deposition process.

As the negative pressure causes removal of the solvent from the precursor solution, the method includes reacting the first precursor with the second precursor and forming or generating the flexible inorganic halide perovskite on the substrate, as a layer or a film.

Regarding the precursor solution, the first perovskite precursor corresponds to the formula AX, A'X, A'X2, or a combination thereof; the second perovskite precursor corresponds to the formula $BX_2$, $B'X_4$, $CX_3$, $DX$, or a combination thereof; and the solvent is selected from the group consisting of N-methyl-2-pyrrolidone (NMP), N,N-dimethylformamide (DMF), dimethyl sulfoxide (DMSO), γ-butyrolactone (GBL), 2-methoxyethyl ether, 2-(2-ethoxyethoxy) ethanol, and combinations thereof. The flexible inorganic halide perovskite corresponds to the formula $A_mB_nX_{m+2n}$, $A_mB_nX_{m'+4n'}$, $A_{m''}B_{n''}B'_{n'''*}X_{m''+2n''+4n''*}$, $A_mC_nX_{m+3n}$, $A_mC_nD_lX_{m+3n+l}$, or $(A'X)_mB_nX_{m+2n}$. In the above formulas, A is a 1+ alkali metal, a 1+ transition metal, a 1+ lanthanide, a 1+ actinide, or a 1+ compound having the formula A'X, wherein A' is an alkaline earth metal, a 2+ transition metal, a 2+ lanthanide, a 2+ actinide, or a combination thereof; A' is an alkaline earth metal, a 2+ transition metal, a 2+ lanthanide, a 2+ actinide, or a combination thereof; B is a 2+ alkaline earth metal, a 2+ transition metal, a 2+ crystallogen, a 2+ lanthanide, a 2+ actinide, or a combination thereof; B' is a 4+ metal or a combination of 4+ metals; C is a 3+ pnictogen, a 3+ icosagen, a 3+ transition metal, or a combination thereof; D is silver (Ag), copper (Cu), gold (Au), indium (In I), thallium (Tl I), or a combination thereof; X is an inorganic anion or a combination of inorganic anions; and m, m', m'', n, n', n'', n''*, and l are individually integers having a value of 0 or greater. In various embodiments, A is cesium (Cs), rubidium (Rb), potassium (K), sodium (Na), lithium (Li), copper (Cu I), or a combination thereof; A' is beryllium (Be), magnesium (Mg), calcium (Ca), strontium (Sr), barium (Ba), iron (Fe II), chromium (Cr II), cobalt (Co II), nickel (Ni II), manganese (Mn II), lead (Pb II), copper (Cu II), vanadium (V II), zinc (Zn II) or a combination thereof; B is tin (Sn), lead (Pb), copper (Cu II), germanium (Ge), or a combination thereof; B' is tin (Sn), germanium (Ge), lead (Pb), or a combination thereof; C is bismuth (Bi), antimony (Sb), indium (In III), iron (Fe), aluminum (Al), or a combination thereof; and X is an inorganic anion selected from the group consisting of a halogen, an oxalate, a hydroxide, a chlorate, an iodate, a nitrite, a sulfate, a thiosulfate, a phosphate, an antimonite, or a combination thereof.

In some embodiments, the method of fabricating a flexible inorganic halide perovskite is free from heating at a temperature of greater than or equal to about 100° C. or greater than or equal to about 30° C. In some embodiments, the method, including the applying negative pressure, is performed at room temperature or ambient temperature, i.e., without supplying heat to remove the solvent. However, evaporative cooling can occur during the application of negative pressure, which can lower a reaction temperature to below room temperature or ambient temperature.

The current technology also provides the flexible inorganic halide perovskite made by the above method. Any of flexible inorganic halide perovskites described herein can be incorporated, for example, as a continuous film, in a photovoltaic device (such as a solar cell or photovoltaic cell), a diode, a circuit, a sensor, a rectifier, a photocoupler, a photocatalyst, a catalyst, a photodetector, a photoconductor, a light emitting diode (LED), a laser, a memory, or a transistor, all of which may be flexible.

The current technology yet further provides a method of fabricating a flexible photovoltaic device. This method includes the above method of fabricating a flexible inorganic halide perovskite on a flexible substrate comprising a first flexible electrode. However, the method of fabricating a flexible photovoltaic device further comprises disposing a second flexible electrode on the flexible inorganic halide perovskite, wherein the flexible inorganic halide perovskite is disposed between the first flexible electrode and the second flexible electrode.

In some embodiments, the method of fabricating a flexible photovoltaic device also comprises disposing at least one adjunct layer between the first flexible electrode and the flexible inorganic halide perovskite, between the second flexible electrode and the flexible inorganic halide perovskite, or between both the first flexible electrode and the flexible inorganic halide perovskite and between the second flexible electrode and the flexible inorganic halide perovskite. The at least one adjunct layer is selected from the group consisting of a hole transport layer, an electron blocking layer, a buffer layer, an electron transport layer, a hole blocking layer, an electron extraction layer, and combinations thereof, as provided above.

The disposing of the second flexible electrode and the at least one adjunct layer can be performed by any means known in the art. Non-limiting examples of means for disposing the various layers include spin coating, dip coating, doctor blading, chemical vapor deposition (CVD), drop casting, spray coating, plasma-sputtering, vacuum depositing, and combinations thereof. The layer or layers are deposited individually and sequentially.

Moreover, in some embodiments, the method is free from annealing at temperatures of greater than or equal to about 100° C., greater than or equal to about 30° C., or greater than or equal to about room temperature or ambient temperature. Put another way, in some embodiments, the method further comprises thermally annealing the flexible inorganic halide perovskite layer or film at a temperature of less than of less than or equal to about 100° C., less than of less than or equal to about 75° C., or less than of less than or equal to about 50° C. In yet other embodiments, the method is free from thermally annealing the flexible inorganic halide perovskite layer or film whatsoever.

The current technology also provides the flexible photovoltaic device made by the above method.

Embodiments of the present technology are further illustrated through the following non-limiting example.

Example 1

Inorganic lead halide perovskite materials have recently attracted attention due to their potential for greater thermal stability compared to hybrid organic perovskites. However, high processing temperatures for converting from a non-perovskite phase to a cubic perovskite phase in many of these systems limits their application in flexible optoelectronic devices. Here, a room temperature processed inorganic perovskite solar cell (PSC) based on $CsPbI_2Br$ as a light harvesting layer is developed. By combining this composition with key precursor solvents, it is shown that inorganic perovskite films can be prepared by a vacuum-assist method under room temperature conditions in air, allowing unencapsulated devices to achieve a power conversion efficiency (PCE) up to 8.67% when measured under 1-sun irradiation. This low temperature processing enables fabrication of highly flexible inorganic photovoltaics based on an inorganic metal halide perovskite material.

Experimental Methods

Materials and Precursor Preparation: 1-methyl-2-pyrrolidone (NMP, anhydrous, 99.5%, Aldrich.), dimethylformamide (DMF, anhydrous, 99.8%, Sigma Aldrich), dimethyl sulfoxide (DMSO, anhydrous, 99.9%, Sigma Aldrich), PEDOT:PSS (Clevios PVP Al 4083, Heraeus, diluted to 5% with water), $PbI_2$ (99%, Sigma Aldrich), CsBr (99.999%, Sigma Aldrich.), $C_{60}$ (99.9%, MER Corporation.) and 2,9-dimethyl-4,7-diphenyl-1,10-phenanthroline (BCP, Lumtech) are used as received.

To prepare the perovskite precursor solution, $PbI_2$: CsBr (461 mg and 213 mg, respectively) are added in NMP (1.2 ml). The solutions are stirred for 1 hour and filtered with 0.45 μm PTFE filters before use.

Device Fabrication: A PEDOT layer and an inorganic perovskite layer are prepared under open air conditions (with a measured relative humidity≤36±4%). The PEDOT solution is spin-coated onto pre-cleaned ITO substrates at 6000 rpm for 20 s. The perovskite precursor is spin-coated on top of the PEDOT film at 6000 rpm for 12 s, and then the substrate is moved into a homemade vacuum chamber, evacuated to approximately 10 mTorr, and left in the chamber for 3 min. The sample is then transferred into a glovebox. For high-temperature films, the substrates are annealed to 260-280° C. for 1 min. The substrates are then moved into the evaporation chamber for deposition of $C_{60}$ (20 nm) and BCP (7.5 nm). Finally, an 80 nm thick silver layer is deposited by thermal evaporation at a base pressure of $3 \times 10^{-6}$ Torr through a shadow mask with a final measured device area of 4.85 $mm^2$.

Measurement and Characterization: Current density-voltage characteristics (J-V curves) are obtained using a Keithley 2420 sourcemeter under AM1.5 G solar simulation (xenon arc lamp with the spectral-mismatch factor of 0.980), where light intensity is measured using a NREL-calibrated Si reference cell with KG5 filter. For devices with annealing treatment, the devices are encapsulated in epoxy in a glovebox before being tested due to their sensitivity to air. The room temperature films and devices, including the flexible devices, are generally tested under ambient air condition (the RH≤36±4%), without any protection or encapsulation. Devices are scanned at a rate of 50 mV $s^{-1}$. EQE measurements are performed using a QTH lamp with a monochromator, chopper, lock-in amplifier, and calibrated Si detector to measure the intensity. XRD data is measured using CuKα (0.154 nm) emission with a Bruker D2 phaser. PL, UV-vis and XRD are measured on un-encapsulated samples in ambient air (the relative humidity≤22±4%). A field-emission scanning electron microscopy (Carl Zeiss Auriga Dual Column FIB SEM) is used to acquire SEM images.

Results and Discussion

Figure 5:
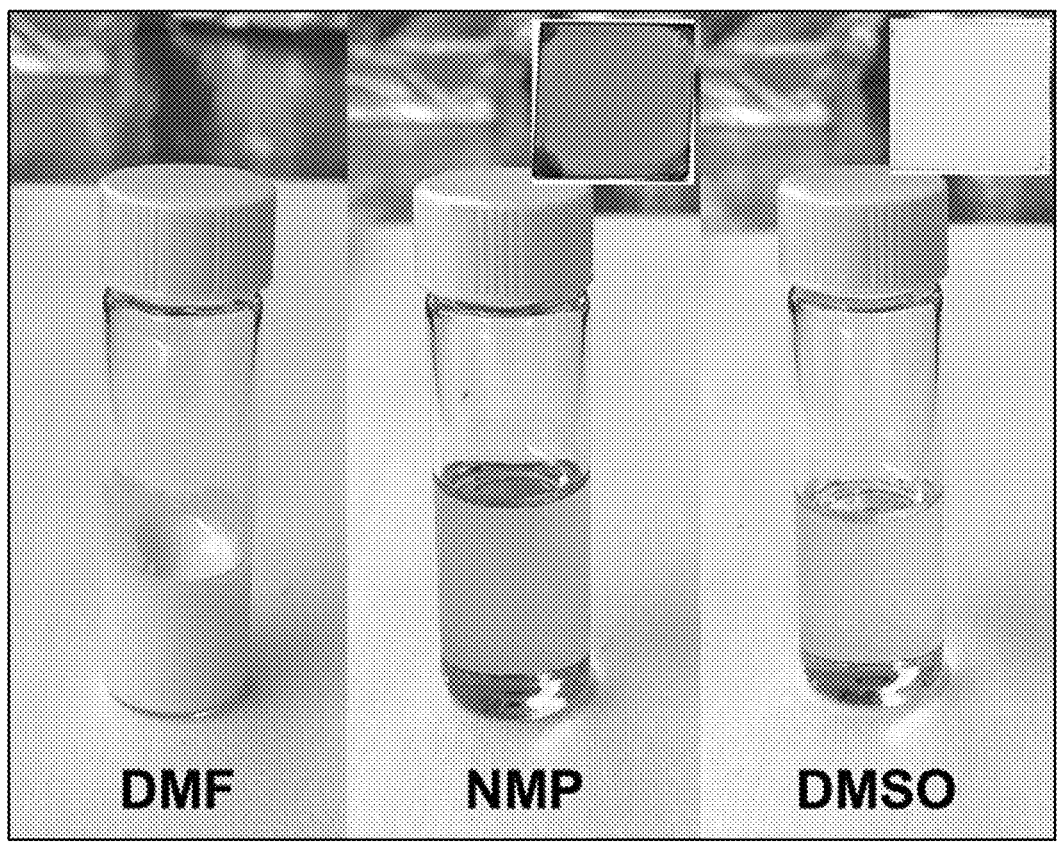
FIG. 5 shows photographs of CsPbI$_2$Br precursor solutions prepared by various solvents. The insets show the films prepared by the relative precursor solutions with the room temperature process.

Due to the limited solubility of lead halide compounds, the precursor solvents generally chosen are N,N-dimethylformamide (DMF), dimethyl sulfoxide (DMSO) and DMF/DMSO mixtures. As shown in FIG. 5, the solubility of mixed halide cesium lead precursors are particularly limited in DMF; therefore, pure DMSO may be utilized. However, DMSO is a Lewis-base with strong coordination capability, which can result in colorless coordination complexes with lead halide compounds, as shown in FIG. 5, and lead to difficulties in converting the lead halide perovskite precursors to the perovskite phase under room temperature. Another polar aprotic solvent that is utilized to fabricate organic-inorganic hybrid perovskite solar cells is 1-methyl-2-pyrrolidone (NMP). Compared with DMF and DMSO, NMP has good solubility for cesium lead halide precursors and weak coordination affinity for lead compounds. NMP has other advantages as well, including better crystallization of perovskite film and miscibility with other solvents, and is generally reported as the solvent to fabricate hybrid organic-inorganic perovskite solar cells under room temperature. Hence, NMP is focused on as the solvent for preparing inorganic lead halide perovskite films with room temperature processing.

As can be seen from the inserts of FIG. 5, the $CsPbI_2Br$ perovskite films can be successfully prepared by the vacuum-assist deposition process under room temperature. After the NMP solvent is extracted from the film under vacuum, the light brown $CsPbI_2Br$ perovskite film is formed. Scanning electron microscopy (SEM) images displayed in FIG. 6 show that the $CsPbI_2Br$ film is smooth and homogenous. Due to the rapid solvent extraction, the $CsPbI_2Br$ film is formed quickly with a low level of crystallization, which leads to a grain size of approximately 50 nm. To investigate the thermal stability of the room temperature processed $CsPbI_2Br$ film, the films are annealed under various temperatures in inert atmosphere. The photograph of these films clearly show that the films maintain a brown color from room temperature to 280° C. Given that the color of the 100° C. film and the 150° C. film differ from some previous studies and agree with others, it is inferred that the film preparation method can dramatically influence the phase conversion temperature and the thermal stability of $CsPbI_2Br$ films. Accordingly, the SEM images indicate that the grain size of $CsPbI_2Br$ films gradually increased from approximately 50 nm at room temperature to approximately 1 μm at 280° C.

The as-prepared $CsPbI_2Br$ films with various annealing temperatures are also investigated by absorption spectroscopy as shown in FIG. 7A, powder X-ray diffraction (XRD) as shown in FIG. 7B, and photoluminescence (PL) spectroscopy as shown in FIG. 7C. The absorption spectra show that all the films have strong absorption from 300 nm to 650 nm wavelength range as displayed in FIG. 7A. After being annealed, the absorption of films presents a peak at 640 nm.

In FIG. 7B, XRD patterns show that at room temperature, the film has cubic perovskite peaks at 2θ=14.7, 20.9, 29.6 and 42.6°, which are indexed to the (100), (110), (200) and (220) planes of $CsPbI_2Br$, respectively. After being annealed, these diffraction peaks become stronger and sharper, which confirms the improved crystallization of the perovskite films. When the film is annealed to 150-250° C., new peaks at 2θ=12.7 and 38.8° are observed. Since the new peaks are agreement with the diffraction peaks of $PbI_2$, it is inferred that a small amount of $CsPbI_2Br$ subsequently decomposes. However, these new peaks then disappear when annealing to 280° C., which indicates the decomposition products re-react to the cubic perovskite phase.

FIG. 7C shows the PL spectra of films. The room temperature film shows a strong PL peak at 645 nm, and the peaks gradually shift to 655 nm after being annealed as the annealing temperature increases from 100° C. to 280° C., combined with a decrease in the PL intensity. It is hypothesized that the PL red shift stems from the increase in the crystal grain size of films, which either eliminates small grains that exhibit some level of quantum confinement or lowers the bandgap due to small changes in the cubic crystal structure. This indicates that the phase separation of the film between 150-250° C. induces PL quenching via the formation of a heterojunction with $PbI_2$. The 200° C. film has the most obvious phase separation and accordingly, has the lowest PL intensity. Following the phase separation, the phase changes back to cubic perovskite phase at 280° C. and the PL intensity is recovered.

The humidity stability of $CsPbI_2Br$ films prepared at room temperature and 280° C. is also investigated. FIG. 8A is the photograph of $CsPbI_2Br$ films before and after a short period (10 minutes) of storage under relative humidity (RH) of 30±4% in open air, respectively. It is clear that the room temperature processed film maintains the brown color. In contrast, the 280° C. film changes color in only 5-10 minutes, which suggests that the film undergoes a phase change or decomposition. The SEM image for the room temperature processed $CsPbI_2Br$ film after storage has no obvious change as shown in FIGS. 9A-9D. In comparison, the 280° C. film shows a clear change with the formation of pinholes on the film surface after storage.

To further investigate the phase change of the 280° C. film under humidity, XRD spectra of the film is continuously measured under room temperature and RH=22±4% in air, as shown in FIG. 8B. The initially prepared 280° C. film shows the characteristic cubic perovskite peaks. During exposure to humidity, the cubic peaks begin to fade, while new diffraction peaks at 2θ=10.0, 13.3, 26.8, 28.1 and 38.4° emerge. After 200 minutes, the peaks of cubic phase completely disappear. In contrast, as displayed in FIG. 8C, no change is observed in the XRD spectra for the room temperature processed $CsPbI_2Br$ film for over 1 week. This indicates that the room temperature processed film has improved humidity stability and will, therefore, lead to improved operational lifetime as well.

Films with larger grain size are generally more compact than films with smaller grain size, and the more compact films should have better stability because of their better resistance to the degradation from moisture and oxygen. However, it is suggested that cesium lead halide perovskite films with small grain size have significantly improved stability than films with larger grain size. The reduction in the number of pinholes and defect passivation on the surface are believed to be the main contributions to the improved stability, which is consistent with what is observed here. Grain boundaries also play an important role in the perovskite film degradation process. Chemical residues at the grain boundaries may be one possible reason for accelerated degradation of perovskite films. Overall, the room temperature processing technique provides an effective approach to improve the humidity stability of $CsPbI_2Br$ films.

Subsequently, the room temperature processed $CsPbI_2Br$ solar cells are prepared with the architecture shown in FIG. 10A. An ultrathin PEDOT layer is first deposited on pre-cleaned ITO substrates. The $CsPbI_2Br$ layer is then prepared on top of the PEDOT layer by the vacuum-assist method in ambient atmosphere. A 20 nm of $C_{60}$ and a 7.5 nm of 2,9-dimethyl-4,7-diphenyl-1,10-phenanthroline (BCP) layer are then thermally evaporated onto the $CsPbI_2Br$ layer, respectively, followed by the silver electrode.

The current-voltage (J-V) characteristics of the devices are shown in FIG. 10B. Under standard AM1.5G illumination, the room temperature processed device shows a PCE of 8.67%, with a short circuit current ($J_{sc}$) of 12.4 mA cm$^{-2}$, a $V_{oc}$ of 1.16 V, and a fill factor (FF) of 60.1%. As shown in FIG. 11, the device shows an external quantum efficiency (EQE) spectrum above 60% from 390 to 620 nm. The integrated photocurrent from the EQE gives a $J_{sc}$ of 12.1 mA cm$^{-2}$, which is in good agreement with the measured value from the J-V data. For the device that is annealed at 280° C., a PCE of 8.02% is obtained. The lower PCE mainly stems from the loss of voltage. The $V_{oc}$ of the 280° C.-film device is only 1.01 V, which is significantly lower than the room-temperature device. The high voltage of the room-temperature device can be attributed to fewer pinholes or shunting pathways. FIG. 10C shows the steady photocurrent and power output of the room-temperature device is 10.6 mA cm$^{-2}$ and 8.30 mW cm$^{-2}$ under a bias of 0.78 V, respectively. Moreover, the room temperature processed device only shows a small photocurrent hysteresis when measured under forward and reversed scan mode as shown in FIG. 10D.

Initial device stability is investigated under continuous light irradiation in air. It can be seen from FIGS. 12A-12B that the $V_{oc}$ of the room temperature processed device is maintained over 90% after over 200 hours continuous 1-sun irradiation. However, the $J_{sc}$ drops by 40% in the first 100 hours and then becomes stable after 100 hours. The PCE of the room temperature processed device maintains about 50% over 180 hours. In contrast, the $J_{sc}$ of the 280° C.-film device exhibits a rapid reduction during the 150 hours test, which results in a relative PCE drop to less than 15% (the original PCE) after 150 hours and less than 1% after 200 hours light irradiation. The smooth and compact perovskite film that is processed at room temperature is expected to contribute to the improved stability over the 280° C.-film device. However, the stability of inorganic lead halide PSC is still lower than that reported for organic-inorganic hybird PSC. Further investigation of the lifetime is a key metric to consider moving forward to fully understand the mechanism of degradation.

Based on the room temperature processing technique, inorganic cesium lead halide perovskite devices are prepared on flexible substrates. An ITO/poly(ethylene terephthalate) (PET) flexible substrate is used to replace the rigid ITO/glass substrate to prepare the flexible device. FIG. 13A shows the J-V curve of the flexible cesium lead halide perovskite solar cell shown in FIG. 13C. The flexible device shows a PCE of 6.50% under 1-sun illumination, with a $J_{sc}$ of 12.0 mA cm$^{-2}$, a $V_{oc}$ of 1.05 V, and a FF of 51.4%. The unencapsulated flexible device maintains an efficiency of 6.05% after 2 months storage in inert atmosphere, which is 93% of the original efficiency.

Bending tests are carried out to check the performance of the flexible device after repeated bend cycles. After 100 bending cycles around a radius of 4.05 mm, the device only shows slight fluctuations in the efficiency as displayed in FIG. 13B. However, the efficiency of the flexible device drops to approximately 80% after 200 bending circles, largely due to drops in the FF, which likely stem from cracking of the ITO/PET flexible substrate. Nonetheless, the development of low cost, flexible, and stable inorganic perovskite solar cells is demonstrated.

CONCLUSIONS

In summary, a simple approach to prepare inorganic lead perovskite films with a room temperature process is demonstrated. The room-temperature film shows improved humidity stability over films prepared by high temperature annealing treatment. Utilizing the room temperature approach, the inorganic lead perovskite solar cells are successfully prepared on rigid substrates and flexible substrates. This demonstrates the integration of inorganic halide perovskites into flexible solar cells and highlights the potential of inorganic perovskite materials for a range of flexible optoelectronic devices.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A flexible photovoltaic device comprising:
an active layer including a flexible inorganic halide perovskite, the active layer having a bend radius of greater than or equal to about 1 mm to less than or equal to about 100 mm, wherein the flexible inorganic halide perovskite
is free of organic components, and
has an average grain size of less than or equal to about 500 nm.

2. The flexible photovoltaic device according to claim 1, wherein the flexible inorganic halide perovskite has a thickness of greater than or equal to about 1 nm to less than or equal to about 1 μm.

3. The flexible photovoltaic device according to claim 1, wherein the average grain size is less than or equal to about 100 nm.

4. The flexible photovoltaic device according to claim 1, wherein the bend radius is greater than or equal to about 3 mm to less than or equal to about 10 mm.

5. The flexible photovoltaic device according to claim 1, wherein the flexible inorganic halide perovskite corresponds to the formula $A_m B_n X_{m+2n}$, $A_m B_n X_{m'+4n'}$, $A_{m'} B_{n''} B'_{n'''*} X_{m''+2n''+4n'''*}$, $A_m C_n X_{m+3n}$, $A_m C_n D_l X_{m+3n+l}$, or $(A'X)_m B_n X_{m+2n}$, wherein:

A is a 1+ alkali metal, a 1+ transition metal, a 1+ lanthanide, a 1+ actinide, or a 1+ compound having the formula A'X;
A' is an alkaline earth metal, a 2+ transition metal, a 2+ lanthanide, a 2+ actinide, or a combination thereof;
B is a 2+ alkaline earth metal, a 2+ transition metal, a 2+ crystallogen, a 2+ lanthanide, a 2+ actinide, or a combination thereof;
B' is a 4+ metal or a combination of 4+ metals;
C is a 3+ pnictogen, a 3+ icosagen, a 3+ transition metal, or a combination thereof;
D is silver (Ag), copper (Cu), gold (Au), indium (In I), thallium (Tl I), or a combination thereof;
X is an inorganic anion or a combination of inorganic anions; and
m, m', m", n, n', n", n"*, and l are individually integers having a value of 0 or greater.

6. The flexible photovoltaic device according to claim 5, wherein the flexible inorganic halide perovskite is selected from the group consisting of $CsSiCl_3$, $CsSiBr_3$, $CsSiI_3$, $RbSiCl_3$, $RbSiBr_3$, $KSiCl_3$, $KSiBr_3$, $KSiI_3$, $Cs_2SiCl_4$, $Cs_2SiBr_4$, $Cs_2SiI_4$, $Rb_2SiCl_4$, $Rb_2SiBr_4$, $Rb_2SiI_4$, $CsSi_2Cl_5$, $Cs_2SiCl_6$, $Cs_2Si(II)Si(IV)Cl_8$, $CsSi_2Br_5$, $Cs_2SiBr_6$, $Cs_2Si(II)Si(IV)Br_8$, $CsSi_2I_5$, $Cs_2SiI_6$, $Cs_2Si(II)Si(IV)I_8$, $RbSi_2Cl_5$, $Rb_2SiCl_6$, $Rb_2Si(II)Si(IV)Cl_8$, $RbSi_2Br_5$, $Rb_2SiBr_6$, $Rb_2Si(II)Si(IV)Br_8$, $RbSi_2I_5$, $Rb_2SiI_6$, $Rb_2Si(II)Si(IV)I_8$, $KSi_2Cl_5$, $K_2SiCl_6$, $K_2Si(II)Si(IV)Cl_8$, $KSi_2Br_5$, $K_2SiBr_6$, $K_2Si(II)Si(IV)Br_8$, $KSi_2I_5$, $K_2SiI_6$, $K_2Si(II)Si(IV)I_8$, $CsGeCl_3$, $CsGeBr_3$, $CsGeI_3$, $RbGeCl_3$, $RbGeBr_3$, $KGeCl_3$, $KGeBr_3$, $KGeI_3$, $Cs_2GeCl_4$, $Cs_2GeBr_4$, $Cs_2GeI_4$, $Rb_2GeCl_4$, $Rb_2GeBr_4$, $Rb_2GeI_4$, $CsGe_2Cl_5$, $Cs_2GeCl_6$, $Cs_2Ge(II)Ge(IV)Cl_8$, $CsGe_2Br_5$, $Cs_2GeBr_6$, $Cs_2Ge(II)Ge(IV)Br_8$, $CsGe_2I_5$, $Cs_2GeI_6$, $Cs_2Ge(II)Ge(IV)I_8$, $RbGe_2Cl_5$, $Rb_2GeCl_6$, $Rb_2Ge(II)Ge(IV)Cl_8$, $RbGe_2Br_5$, $Rb_2GeBr_6$, $Rb_2Ge(II)Ge(IV)Br_8$, $RbGe_2I_5$, $Rb_2GeI_6$, $Rb_2Ge(II)Ge(IV)I_8$, $KGe_2Cl_5$, $K_2GeCl_6$, $K_2Ge(II)Ge(IV)Cl_8$, $KGe_2Br_5$, $K_2GeBr_6$, $K_2Ge(II)Ge(IV)Br_8$, $KGe_2I_5$, $K_2GeI_6$, $K_2Ge(II)Ge(IV)I_8$, $CsSnCl_3$, $CsSnBr_3$, $CsSnI_3$, $RbSnCl_3$, $RbSnBr_3$, $KSnCl_3$, $KSnBr_3$, $KSnI_3$, $Cs_2SnCl_4$, $Cs_2SnBr_4$, $Cs_2SnI_4$, $Rb_2SnCl_4$, $Rb_2SnBr_4$, $Rb_2SnI_4$, $CsSn_2Cl_5$, $Cs_2SnCl_6$, $Cs_2Sn(II)Sn(IV)Cl_8$, $CsSn_2Br_5$, $Cs_2SnBr_6$, $Cs_2Sn(II)Sn(IV)Br_8$, $CsSn_2I_5$, $Cs_2SnI_6$, $Cs_2Sn(II)Sn(IV)I_8$, $RbSn_2Cl_5$, $Rb_2SnCl_6$, $Rb_2Sn(II)Sn(IV)Cl_8$, $RbSn_2Br_5$, $Rb_2SnBr_6$, $Rb_2Sn(II)Sn(IV)Br_8$, $RbSn_2I_5$, $Rb_2SnI_6$, $Rb_2Sn(II)Sn(IV)I_8$, $KSn_2Cl_5$, $K_2SnCl_6$, $K_2Sn(II)Sn(IV)Cl_8$, $KSn_2Br_5$, $K_2SnBr_6$, $K_2Sn(II)Sn(IV)Br_8$, $KSn_2I_5$, $K_2SnI_6$, $K_2Sn(II)Sn(IV)I_8$, $Cs_3Bi_2Cl_9$, $Cs_3Bi_2Br_9$, $Cs_3Bi_2I_9$, $Cs_3Sb_2Cl_9$, $Cs_3Sb_2Br_9$, $Cs_3Sb_2I_9$, $CsPbCl_3$, $CsPbBr_3$, $CsPbI_3$, $CsPbI_2Br$, $CsPbIBr_2$, $Cs_2TiCl_6$, $Cs_2TiBr_6$, $Cs_2TiI_6$, $Cs_2TiCl_3Br_3$, $Cs_2TiCl_3I_3$, $Cs_2TiBr_3I_3$, $Cs_2TiCl_2Br_4$, $Cs_2TiCl_2I_4$, $Cs_2TiCl_4Br_2$, $Cs_2TiCl_4I_2$, $Cs_2TiBr_2I_4$, $Cs_2TiBr_4I_2$, $RbPbCl_3$, $RbPbBr_3$, $KPbCl_3$, $KPbBr_3$, $KPbI_3$, $Cs_2PbCl_4$, $Cs_2PbBr_4$, $Cs_2PbI_4$, $Rb_2PbCl_4$, $Rb_2PbBr_4$, $Rb_2PbI_4$, $CsPb_2Cl_5$, $Cs_2PbCl_6$, $Cs_2Pb(II)Pb(IV)Cl_8$, $CsPb_2Br_5$, $Cs_2PbBr_6$, $Cs_2Pb(II)Pb(IV)Br_8$, $CsPb_2I_5$, $Cs_2PbI_6$, $Cs_2Pb(II)Pb(IV)I_8$, $RbPb_2Cl_5$, $Rb_2PbCl_6$, $Rb_2Pb(II)Pb(IV)Cl_8$, $RbPb_2Br_5$, $Rb_2PbBr_6$, $Rb_2Pb(II)Pb(IV)Br_8$, $RbPb_2I_5$, $Rb_2PbI_6$, $Rb_2Pb(II)Pb(IV)I_8$, $KPb_2Cl_5$, $K_2PbCl_6$, $K_2Pb(II)Pb(IV)Cl_8$, $KPb_2Br_5$, $K_2PbBr_6$, $K_2Pb(II)Pb(IV)Br_8$, $KPb_2I_5$, $K_2PbI_6$, $K_2Pb(II)Pb(IV)I_8$, $Cs_2AgBiCl_6$, $Cs_2CuBiCl_6$, $Cs_2InAgCl_6$, $Cs_2InCuCl_6$, $Cs_2AgSbCl_6$, $Cs_2CuSbCl_6$, $Cs_2AgBiBr_6$, $Cs_2CuBiBr_6$, $Cs_2InAgBr_6$, $Cs_2InCuBr_6$, $Cs_2AgBiI_6$, $Cs_2CuBiI_6$, $Cs_2AgSbBr_6$, $Cs_2CuSbBr_6$, $Cs_2AgSbI_6$, $Cs_2CuSbI_6$, $Cs_2InAgI_6$, $Cs_2InCuI_6$, $Cs_3Bi_2Cl_9$, $Cs_3Bi_2Br_9$, $Cs_3Bi_2I_9$, $Cs_3Sb_2Cl_9$, $Cs_3Sb_2Br_9$, $Cs_3Sb_2I_9$, $Cs_3In_2Cl_9$, $Cs_3In_2Br_9$, $Cs_3In_2I_9$, $K_2AgBiCl_6$, $K_2CuBiCl_6$, $K_2InAgCl_6$, $K_2InCuCl_6$, $K_2AgSbCl_6$, $K_2CuSbCl_6$, $K_2AgBiBr_6$, $K_2CuBiBr_6$, $K_2InAgBr_6$, $K_2InCuBr_6$, $K_2AgBiI_6$, $K_2CuBiI_6$, $K_2AgSbBr_6$, $K_2CuSbBr_6$, $K_2AgSbI_6$, $K_2CuSbI_6$, $K_2InAgI_6$, $K_2InCuI_6$, $K_3Bi_2Cl_9$, $K_3Bi_2Br_9$, $K_3Bi_2I_9$, $K_3Sb_2Cl_9$, $K_3Sb_2Br_9$, $K_3Sb_2I_9$, $K_3In_2Cl_9$, $K_3In_2Br_9$, $K_3In_2I_9$, $Na_2AgBiCl_6$, $Na_2CuBiCl_6$, $Na_2InAgCl_6$, $Na_2InCuCl_6$, $Na_2AgSbCl_6$, $Na_2CuSbCl_6$, $Na_2AgBiBr_6$, $Na_2CuBiBr_6$, $Na_2InAgBr_6$, $Na_2InCuBr_6$, $Na_2AgBiI_6$, $Na_2CuBiI_6$, $Na_2AgSbBr_6$, $Na_2CuSbBr_6$, $Na_2AgSbI_6$, $Na_2CuSbI_6$, $Na_2InAgI_6$, $Na_2InCuI_6$, $Na_3Bi_2Cl_9$, $Na_3Bi_2Br_9$, $Na_3Bi_2I_9$, $Na_3Sb_2Cl_9$, $Na_3Sb_2Br_9$, $Na_3Sb_2I_9$, $Na_3In_2Cl_9$, $Na_3In_2Br_9$, $Na_3In_2I_9$, $Li_2AgBiCl_6$, $Li_2CuBiCl_6$, $Li_2InAgCl_6$, $Li_2InCuCl_6$, $Li_2AgSbCl_6$, $Li_2CuSbCl_6$, $Li_2AgBiBr_6$, $Li_2CuBiBr_6$, $Li_2InAgBr_6$, $Li_2InCuBr_6$, $Li_2AgBiI_6$, $Li_2CuBiI_6$, $Li_2AgSbBr_6$, $Li_2CuSbBr_6$, $Li_2AgSbI_6$, $Li_2CuSbI_6$, $Li_2InAgI_6$, $Li_2InCuI_6$, $Li_3Bi_2Cl_9$, $Li_3Bi_2Br_9$, $Li_3Bi_2I_9$, $Li_3Sb_2Cl_9$, $Li_3Sb_2Br_9$, $Li_3Sb_2I_9$, $Li_3In_2Cl_9$, $Li_3In_2Br_9$, $Li_3In_2I_9$, and combinations thereof.

7. The flexible photovoltaic device according to claim 1, further comprising:
a substrate comprising an electrically conductive surface, wherein the flexible inorganic halide perovskite is disposed on the electrically conductive surface of the substrate.

8. The flexible photovoltaic device according to claim 7, wherein the entire substrate is electrically conductive.

9. The flexible photovoltaic device according to claim 7, wherein the substrate comprises an electrically non-conductive layer and an electrically conductive layer, and wherein the electrically conductive layer comprises the electrically conductive surface.

10. The flexible photovoltaic device according to claim 7, wherein the electrically conductive surface is a first electrode and the flexible photovoltaic device further comprises:
a second electrode disposed on the flexible inorganic halide perovskite,
wherein the flexible inorganic halide perovskite is disposed between the first electrode and the second electrode.

11. The flexible photovoltaic device according to claim 10, wherein each of the substrate, the first electrode, and the second electrode are flexible.

12. The flexible photovoltaic device according to claim 10, further comprising:
at least one flexible adjunct layer selected from the group consisting of a hole transport layer, an electron blocking layer, a buffer layer, an electron transport layer, a hole blocking layer, an electron extraction layer; and combinations thereof,
wherein the at least one flexible adjunct layer is disposed between the first electrode and the flexible inorganic halide perovskite, between the second electrode and the flexible inorganic halide perovskite, or between both the first electrode and the flexible inorganic halide perovskite and between the second electrode and the flexible inorganic halide perovskite.

13. The flexible photovoltaic device according to claim 1, wherein the flexible photovoltaic device has a power conversion efficiency (PCE) of greater than or equal to about 5%.

14. The flexible photovoltaic device according to claim 1, wherein the flexible inorganic halide perovskite is provided in a layer and the entire flexible photovoltaic device is visibly transparent.

15. The flexible photovoltaic device according to claim 1, wherein the flexible inorganic halide perovskite is not thermally annealed.

16. The flexible photovoltaic device according to claim 1, wherein the flexible inorganic halide perovskite is thermally annealed at a temperature of less than or equal to about 100° C.

17. The flexible photovoltaic device according to claim 1, comprising an active layer consisting essentially of the flexible inorganic halide perovskite.

18. The flexible photovoltaic device according to claim 1, wherein the flexible inorganic halide perovskite is disposed directly on an electrode or a wetting layer.

19. The flexible photovoltaic device according to claim 1, further comprising:
a substrate comprising poly(methyl methacrylate) (PMMA), poly-(ethylmethacrylate) (PEMA), (poly)-butyl methacrylate-co-methyl methacrylate (PBMMA), or any combination thereof.

20. The flexible photovoltaic device according to claim 1, wherein
the flexible inorganic halide perovskite has a grain size of less than or equal to about 300 nm, and
the active layer has a thickness of less than or equal to about 1 μm.

21. The flexible photovoltaic device according to claim 1, wherein the flexible inorganic halide perovskite includes cubic perovskite phase.

22. The flexible photovoltaic device according to claim 1, wherein
the flexible inorganic halide perovskite has a grain size of less than or equal to about 200 nm,
the flexible inorganic halide perovskite includes cubic perovskite phase, and
the active layer has a thickness of less than or equal to about 1 μm.

23. A method of fabricating a flexible inorganic halide perovskite, the method comprising:
disposing a precursor solution on a substrate, the precursor solution comprising a first perovskite precursor and a second perovskite precursor dissolved in a solvent;
removing the solvent; and
generating an active layer including the flexible inorganic halide perovskite on the substrate, the active layer having a bend radius of greater than or equal to about 1 mm to less than or equal to about 100 mm, the flexible inorganic halide perovskite being free of organic components and having an average grain size of less than or equal to about 500 nm;
wherein the method is free from heating at temperatures of greater than 100° C.

24. The method according to claim 23, wherein the method is free from heating at a temperature of greater than 30° C.

25. The method according to claim 23, wherein the first perovskite precursor corresponds to the formula AX, A'X, A'X$_2$, or a combination thereof, and the second perovskite precursor corresponds to the formula BX$_2$, B'X$_4$, CX$_3$, DX, or a combination thereof, and the method further comprises:
reacting the first perovskite precursor with the second perovskite precursor to form the flexible inorganic halide perovskite, the flexible inorganic halide perovskite corresponding to the formula $A_mB_nX_{m+2n}$, $A_mB_nX_{m'+4n'}$, $A_{m''}B_{n''}B'_{n'''}X_{m''+2n''+4n'''}$, $A_mC_nX_{m+3n}$, $A_mC_nD_lX_{m+3n+l}$, or $(A'X)_mB_nX_{m+2n}$,
wherein:
A is a 1+ alkali metal, a 1+ transition metal, a 1+ lanthanide, a 1+ actinide, or a 1+ compound having the formula A'X,
A' is an alkaline earth metal, a 2+ transition metal, a 2+ lanthanide, a 2+ actinide, or a combination thereof;
B is a 2+ alkaline earth metal, a 2+ transition metal, a 2+ crystallogen, a 2+ lanthanide, a 2+ actinide, or a combination thereof;

B' is a 4+ metal or a combination of 4+ metals;

C is a 3+ pnictogen, a 3+ icosagen, a 3+ transition metal, or a combination thereof;

D is silver (Ag), copper (Cu), gold (Au), indium (In I), thallium (Tl I), or a combination thereof;

X is an inorganic anion or a combination of inorganic anions; and m, m', m'', n, n', n'', n''*, and l are individually integers having a value of 0 or greater.

26. The method according to claim 23, wherein:

A is cesium (Cs), rubidium (Rb), potassium (K), sodium (Na), lithium (Li), copper (Cu I), or a combination thereof;

A' is beryllium (Be), magnesium (Mg), calcium (Ca), strontium (Sr), barium (Ba), iron (Fe II), chromium (Cr II), cobalt (Co II), nickel (Ni II), manganese (Mn II), lead (Pb II), copper (Cu II), vanadium (V II), zinc (Zn II), or a combination thereof;

B is tin (Sn), lead (Pb), copper (Cu II), germanium (Ge), or a combination thereof;

B' is tin (Sn), germanium (Ge), lead (Pb), or a combination thereof;

C is bismuth (Bi), antimony (Sb), indium (In III), iron (Fe), aluminum (Al), or a combination thereof; and X is an inorganic anion selected from the group consisting of a halogen, an oxalate, a hydroxide, a chlorate, an iodate, a nitrite, a sulfate, a thiosulfate, a phosphate, an antimonite, or a combination thereof.

27. The method according to claim 23, wherein the solvent is selected from the group consisting of N-methyl-2-pyrrolidone (NMP), N,N-dimethylformamide (DMF), dimethyl sulfoxide (DMSO), γ-butyrolactone (GBL), 2-methoxyethyl ether, 2-(2-ethoxyethoxy)ethanol, and combinations thereof.

28. The method according to claim 23, wherein the precursor solution further comprises a dopant dissolved in the solvent.

29. The method according to claim 23, wherein the substrate comprises a first flexible electrode.

30. The method according to claim 29, further comprising:

disposing a second flexible electrode on the flexible inorganic halide perovskite, wherein the flexible inorganic halide perovskite is disposed between the first flexible electrode and the second flexible electrode.

31. The method according to claim 30, further comprising:

disposing at least one adjunct layer between the first flexible electrode and the flexible inorganic halide perovskite, between the second flexible electrode and the flexible inorganic halide perovskite, or between both the first flexible electrode and the flexible inorganic halide perovskite and between the second flexible electrode and the flexible inorganic halide perovskite, wherein the at least one adjunct layer is selected from the group consisting of a hole transport layer, an electron blocking layer, a buffer layer, an electron transport layer, a hole blocking layer, an electron extraction layer; and combinations thereof.

32. The method according to claim 23, further comprising:

Including the flexible inorganic perovskite film in a photovoltaic device, the photovoltaic device being flexible and visibly transparent.

33. The method according to claim 23, wherein the method is free from thermally annealing the flexible inorganic halide perovskite.

34. The method according to claim 23, further comprising:

thermally annealing the flexible inorganic halide perovskite at a temperature of less than or equal to about 100° C.

35. The method according to claim 23, wherein the removing the solvent is performed by applying a negative pressure to the precursor solution at room temperature.

36. The method according to claim 35, wherein the applying the negative pressure to the precursor solution comprises subjecting the precursor solution to a negative pressure of less than or equal to about 1500 mTorr for a time period of greater than or equal to about 5 seconds to less than or equal to about 24 hours.

37. A flexible photovoltaic device comprising:

an active layer comprising a light absorbing material consisting essentially of a flexible inorganic halide perovskite, the active layer consisting essentially of the flexible inorganic halide perovskite, wherein the flexible inorganic halide perovskite is free of organic components, and has an average grain size of less than or equal to about 500 nm.

* * * * *